(12) United States Patent
Saito et al.

(10) Patent No.: US 8,570,302 B2
(45) Date of Patent: Oct. 29, 2013

(54) DISPLAY DEVICE HAVING A PHOTOSENSOR AND A CORRECTION SENSOR

(75) Inventors: Teruaki Saito, Mobara (JP); Hideo Sato, Hitachi (JP); Shigeyuki Nishitani, Mobara (JP)

(73) Assignees: Hitachi Displays, Ltd., Chiba-ken (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 1240 days.

(21) Appl. No.: 12/155,611

(22) Filed: Jun. 6, 2008

(65) Prior Publication Data

US 2009/0002341 A1    Jan. 1, 2009

(30) Foreign Application Priority Data

Jun. 7, 2007    (JP) .................................. 2007-151571

(51) Int. Cl.
*G06F 3/042* (2006.01)

(52) U.S. Cl.
USPC .......................................... 345/175; 345/173

(58) Field of Classification Search
USPC ................ 345/173, 175, 176, 55, 76, 81, 102
See application file for complete search history.

(56) References Cited

U.S. PATENT DOCUMENTS

| | | | | |
|---|---|---|---|---|
| 5,130,773 | A * | 7/1992 | Tsukada | 257/258 |
| 6,046,466 | A * | 4/2000 | Ishida et al. | 257/258 |
| 6,243,069 | B1 * | 6/2001 | Ogawa et al. | 345/102 |
| 6,828,951 | B2 * | 12/2004 | Yamazaki et al. | 345/77 |
| 7,068,246 | B2 * | 6/2006 | Yamazaki et al. | 345/76 |
| 7,388,569 | B2 * | 6/2008 | Agari et al. | 345/102 |
| 7,423,639 | B2 * | 9/2008 | Min | 345/207 |
| 7,462,863 | B2 | 12/2008 | Izumi | |
| 7,515,125 | B2 * | 4/2009 | Yamazaki et al. | 345/76 |
| 7,586,479 | B2 | 9/2009 | Park et al. | |
| 7,595,795 | B2 * | 9/2009 | Shin et al. | 345/207 |
| 7,619,194 | B2 * | 11/2009 | Kobashi | 250/205 |
| 7,759,627 | B2 * | 7/2010 | Kunimori et al. | 250/214 AL |
| 7,825,998 | B2 * | 11/2010 | Chen et al. | 349/12 |
| 7,928,972 | B2 * | 4/2011 | Sato et al. | 345/207 |
| 7,940,252 | B2 * | 5/2011 | Chuang et al. | 345/175 |
| 2004/0227719 | A1 * | 11/2004 | Chang et al. | 345/102 |
| 2005/0218302 | A1 * | 10/2005 | Shin et al. | 250/214 R |

(Continued)

FOREIGN PATENT DOCUMENTS

| | | |
|---|---|---|
| JP | 07-261932 | 3/1994 |
| JP | 2000-131137 | 10/1998 |
| JP | 2007-094098 | 4/2007 |

*Primary Examiner* — Jason Mandeville
(74) *Attorney, Agent, or Firm* — Stites & Harbison PLLC; Juan Carlos A. Marquez, Esq.

(57) ABSTRACT

It is an object of the present invention to allow a specified function to be readily selected in a mobile telephone or the like without performing a complicated operation. A liquid crystal (30) is sandwiched between a TFT substrate (10) and a color filter substrate (20). A photosensor TFT (130) for selecting the function is disposed on the periphery of an effective screen of the TFT substrate (10). A window (24) is provided in a portion of the color filter substrate corresponding to the photosensor TFT (130), and the outside light is blocked as a result of the user touching a finger to the window. A signal from the photosensor is used for selecting the function. A correction sensor TFT (133) is disposed adjacent to the photosensor TFT (130), to thereby eliminating noise caused by the temperature distribution, stray light, or the like, and erroneous operation of the photosensor is prevented.

13 Claims, 20 Drawing Sheets

(56) References Cited

U.S. PATENT DOCUMENTS

2005/0275616 A1* 12/2005 Park et al. ............... 345/102
2007/0171157 A1* 7/2007 Choi et al. ............... 345/81
2007/0247416 A1* 10/2007 Chang et al. ............... 345/102
2008/0055498 A1* 3/2008 Abileah et al. ............... 349/12
2008/0084366 A1* 4/2008 Saito et al. ............... 345/76
2009/0066897 A1* 3/2009 Katoh et al. ............... 349/116

* cited by examiner

DISPLAY DEVICE HAVING A PHOTOSENSOR AND A CORRECTION SENSOR

CROSS-REFERENCE TO RELATED APPLICATION

The present application claims priority from Japanese application JP2007-151571 filed on Jun. 7, 2007, the content of which is hereby incorporated by reference into this application.

BACKGROUND OF THE INVENTION

1. Field of the Invention

The present invention relates to a display device, and more particularly to a display device in which a photosensor is disposed on the outside of an effective screen, and means is provided for selecting a display function using this photosensor.

2. Description of the Related Art

Flat panel displays such as liquid crystal display devices and the like are widely used in mobile telephones and the like. In recent years, mobile telephones in particular have shown an increase in functionality, and in cases where certain operations are performed, depending on the function, it may be necessary to perform numerous selections from the menu selection screen until the desired function is reached. It is difficult to handle such an operating method unless the operator is experienced in the operation, and the painstakingly established function cannot be employed to good advantage.

On the other hand, there are inventions in which sensor elements are built into a liquid crystal display panel using thin-film transistors (TFT), and used as input means. Japanese Laid-Open Patent Application No. 7-261932 may be cited as an example of a document in which such an invention is disclosed.

Furthermore, a construction is described in Japanese Laid-Open Patent Application No. 2000-131137 in which a liquid crystal display device which produces a display by simultaneously utilizing light from a backlight and outside light has optical sensors for sensing the intensity of the outside light, and appropriately detects the intensity of the outside light by shifting the positions of the sensors and opening parts in a light-blocking layer. However, the technique described in this reference is not a technique in which a photosensor is used as a sensor for selecting a specified function.

SUMMARY OF THE INVENTION

If the screen is large, then for specified functions that are frequently used, the user can select required functions, for example, using icons provided to the top and bottom parts of the screen or the like. However, in mobile telephones and the like, the screen is small; therefore, it is difficult to dispose numerous icons thereon. Furthermore, carrying a mouse is inconvenient for the user, and a function that causes a pointer to move by sliding the fingers instead of using a mouse also takes up space, and is impractical in mobile telephones or the like.

The technique described in Japanese Laid-Open Patent Application No. 7-261932 is a technique in which a liquid crystal display panel is used as the main input means for an information processing device, and in which both finger input and pen input are possible. However, it is difficult to apply such an input method to a display having a small screen such as on a mobile telephone. Furthermore, it is also bothersome to carry around with an input pen.

The construction according to a first aspect of the present invention is a display device having a substrate on which pixels are disposed in the form of a matrix on an effective screen, and an image signal applied to each of the pixels is controlled by a thin-film transistor corresponding to the respective pixels, wherein a photosensor formed using a thin-film transistor is disposed on the substrate on an outside of the effective screen, the photosensor generates a signal as a result of outside light being blocked, and the signal from the photosensor causes the display device to perform a specified function; and a correction sensor formed using a thin-film transistor is formed in the vicinity of the photosensor.

The construction according to a second aspect of the present invention is a display device having a substrate on which pixels are disposed in the form of a matrix on an effective screen, and an image signal applied to each of the pixels is controlled by a thin-film transistor corresponding to the respective pixels, wherein a photosensor formed using a thin-film transistor is disposed on the substrate on an outside of the effective screen, the photosensor generates a signal as a result of outside light being blocked, and the signal from the photosensor causes the display device to perform a specified function; a correction sensor formed using a thin-film transistor is formed in the vicinity of the photosensor; and the thin-film transistor of the photosensor is covered by a light-blocking layer for blocking the outside light, except for the drain part, and the thin-film transistor of the correction sensor is covered by a light-blocking layer for blocking the outside light.

Such aspects of the present invention can be applied to display devices using thin-film transistors as switching elements for pixels, as in liquid crystal display devices, organic EL display devices, or the like.

In the present invention, specified functions can be selected by touching the substrate corresponding to photosensors disposed outside the effective screen; consequently, operation is facilitated. Accordingly, the present invention has the superior merit of allowing necessary functions to be used even by persons who are not accustomed to the operation of mobile telephones or the like.

Correction sensors are installed in the vicinity of the photosensors; accordingly, erroneous operation of the photosensors caused by stray light from a back lighting, or erroneous operation caused by the effects of the thermal distribution, can be prevented. In another aspect of the present invention, the thin-film transistors forming the photosensors are screened from outside light except for the drain parts; accordingly, light noise from the outside environment can be alleviated; furthermore, reflection from the metal electrodes forming the thin-film transistors can be prevented, and damage of the external appearance of the display device can be prevented.

DETAILED DESCRIPTION OF THE INVENTION

Figure 1:
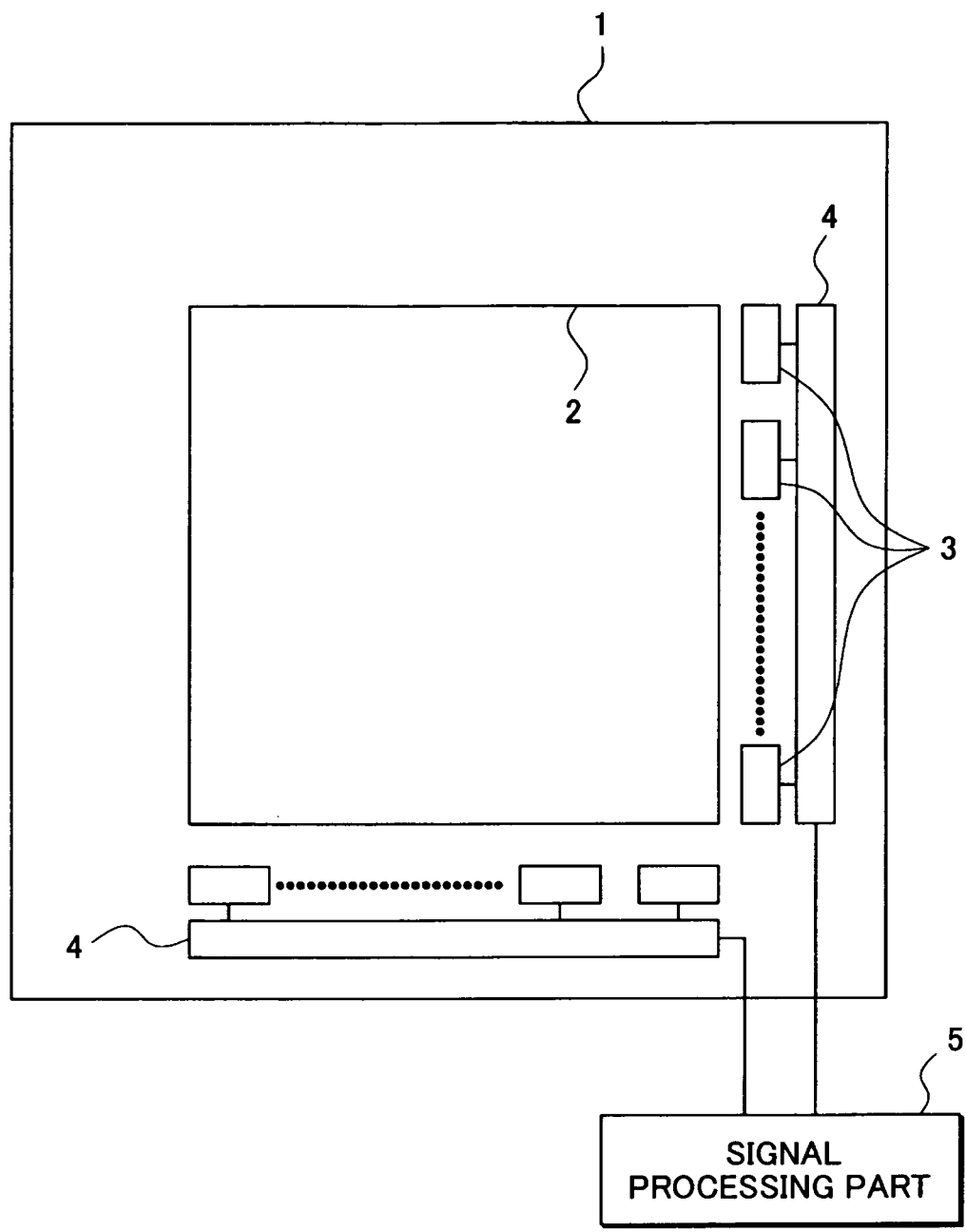
FIG. 1 is a schematic plan view of a display device according to an embodiment of the present invention.

FIG. 1 is a schematic diagram showing an outline of the display device 1 according to an embodiment of the present invention. The display device 1 may be a liquid crystal display device, organic EL display device, or the like; there are no particular restrictions on this display device. An effective screen part 2 for displaying images is installed inside the display panel, and a photosensor part 3 is located on the outside of the effective screen part 2.

In FIG. 1, a plurality of photosensor parts 3 are located along the vertical and horizontal directions of the effective screen. These photosensor parts function as so-called touch sensors in which the output varies as a result of the parts being touched by the fingers of the user, and these signals are detected. The function of an information processing device corresponds to each photosensor part 3. Specifically, the user of the display device 1 selects necessary functions by touching the photosensor parts 3.

The outputs from the photosensor parts 3 are sent to a signal processing part 5 via parallel/serial (P/S) converter circuits 4, and a signal processing part 5 determines which function has been selected according to the signal sent from the P/S converter circuit 4. The selected function is then displayed on the effective screen.

EXAMPLE 1

Figure 2:
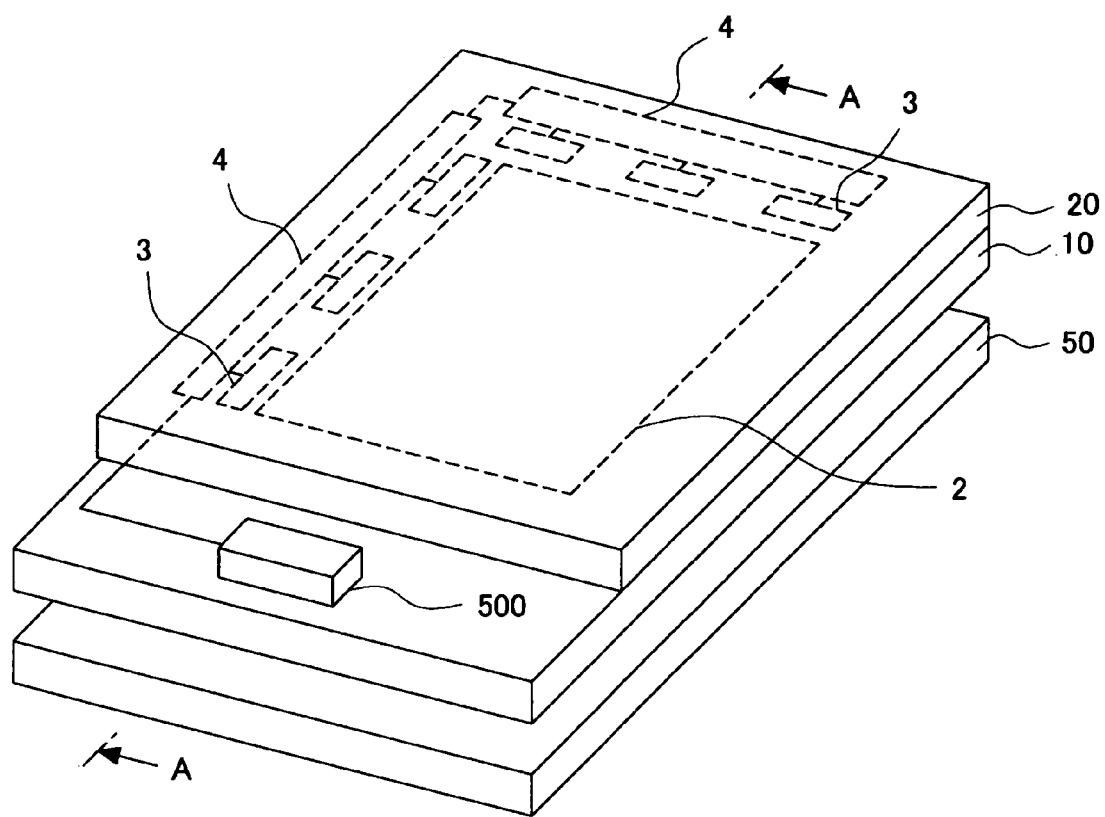
FIG. 2 is a perspective view of a display device according to Example 1.
Figure 3:
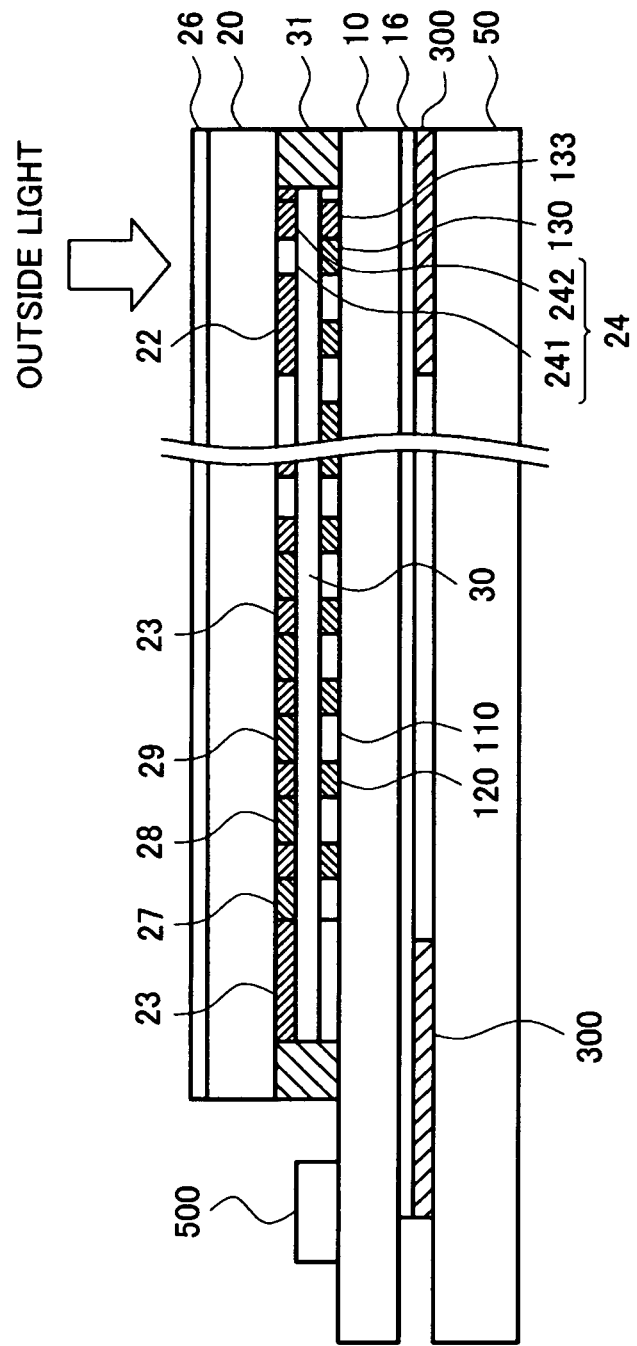
FIG. 3 is a sectional view of the display device according to Example 1.

FIG. 2 is a perspective view showing an example (Example 1) in which the present invention is applied to a liquid crystal display device. FIG. 3 is a schematic sectional view of a liquid crystal display device showing a section along line A-A in FIG. 2. The liquid crystal display device comprises a liquid crystal display panel and back lighting 50. The liquid crystal display panel comprises a TFT substrate 10 on which TFTs for controlling the pixels, pixel electrodes, and the like are formed, a color filter substrate 20 on which color filters and the like are formed, and a liquid crystal which is sandwiched between these substrates. The liquid crystal 30 is sealed between the TFT substrate 10 and the color filter substrate 20 by a sealing member 31.

The back lighting 50 comprises a light source such as an LED or the like, and a variety of optical sheets which concentrate light in the direction of the liquid crystal display panel. The light from the back lighting 50 is controlled using the liquid crystal 30, whereby the liquid crystal display device forms images.

In order to control the light from the back lighting 50 using the liquid crystal display panel, it is necessary that the light incident on the liquid crystal display panel be polarized light. A lower polarizing plate 16 that is affixed to the underside of the TFT substrate 10 is used in order to convert the light from the back lighting 50 into polarized light. The plane of polarization of the light polarized by the lower polarizing plate 16 is rotated by the liquid crystal 30 of the liquid crystal display panel, and is analyzed by an upper polarizing plate affixed to the color filter substrate 20. In this way, controlled light is emitted from the upper polarizing plate 26, and is recognized by the human eye.

In order to control the light using the liquid crystal 30, it is necessary to apply an electric field to the liquid crystal 30. In the respective pixels, the degree of the electric field that is applied to the liquid crystal 30 is determined by image signals. The pixel part TFTs 120 formed on the TFT substrate 10 play a switching role in transmitting these image signals to the pixels. The light passing through the liquid crystal 30 passes through color filters such as red filters 27, green filters 28, blue filters 29, or the like formed on the color filter substrate 20, so that color images are formed. A black matrix (BM) 23 is formed between the respective color filters in order to improve the contrast.

In FIG. 2, photosensor parts 3 are formed on the outside of the effective screen. The output from each photosensor part 3 is transferred to an IC chip 500 constituting a signal processing part 5 via a P/S converter circuit 4. A decision is made as to which photosensor part 3 generated the signal, and the function corresponding to this photosensor part 3 is displayed on the effective screen.

In cases where the TFTs and the like are formed from polysilicon or the like, the photosensor part 3 and P/S converter circuits 4 in FIG. 2 can be formed at the same time when the pixel TFTs and the like of the effective screen are formed. Furthermore, the signals from the photosensor parts 3 that have passed through the P/S converter circuits 4 can be subjected to information processing by circuits formed within IC chips that make it possible to increase the degree of integration.

As is shown in FIG. 3, the photosensors of the photosensor parts 3 are constructed from TFTs formed on the TFT substrate 10 outside the effective screen. The photosensor TFTs 130 are formed by the same process as the pixel part TFTs 120 or peripheral driving circuit TFTs. However, in the photosensor TFTs 130, the gates and drains are connected, and a type of diode is formed; in this case, the TFT acts as a photodiode.

The photoelectric currents generated by the photosensor TFTs 130 are affected by the temperature and the stray light from the back lighting and the like. Specifically, the effects of temperature or stray light may give rise to erroneous operation. In the present example, in order to prevent the effects of temperature or stray light, correction sensors are disposed in the vicinity of the photosensors. The correction sensors are formed from TFTs similar to the photosensors, but are constructed so that outside light does not enter the correction sensors. Furthermore, the amount of outside light can be accurately detected by detecting the difference between the current from the photosensors and the current from the correction sensors.

Not just one, but a plurality of the photosensor TFTs 130 and correction sensors 133 are formed in each of the photosensor parts 3 shown in FIG. 2. The pitch of the photosensor TFTs 130 is much smaller than the windows 24 constituting the touch areas, and numerous photosensor TFTs 130 can easily be formed in these areas. The correction sensor TFTs 133 are also similar. Furthermore, if a plurality of photosensor TFTs 130 is used, the sensitivity as sensors can be improved.

The photosensor TFTs 130 are formed on the TFT substrate 10 by the same process as the pixel part TFTs 120 or driving circuit TFTs. In the present example, in an ordinary state, this is a state in which light is incident on the photosensor TFTs. Then, when the user touches the position corresponding to the photosensor with their finger, the light is blocked, and a signal is recognized.

An upper light-blocking layer 22 which blocks light is formed on the portions of the color filter substrate other than the effective screen, and windows 24 are formed in the parts corresponding to the photosensor TFTs 130. Having the upper light-blocking layer 22 formed by the same process as the BM 23 formed inside the effective screen results in a dramatic light-blocking effect, and provides cost-related advantages. FIG. 3 shows an example in which these windows are formed by the BM 23. In FIG. 3, the windows 24 are constructed from opening parts 241, and light-blocking parts 242 formed by BMs 23. Photosensor TFTs 130 are disposed on the TFT substrate 10 corresponding to the opening parts 241, and correction sensor TFTs 133 are disposed on the TFT substrate corresponding to the light-blocking parts 242.

Figure 4:
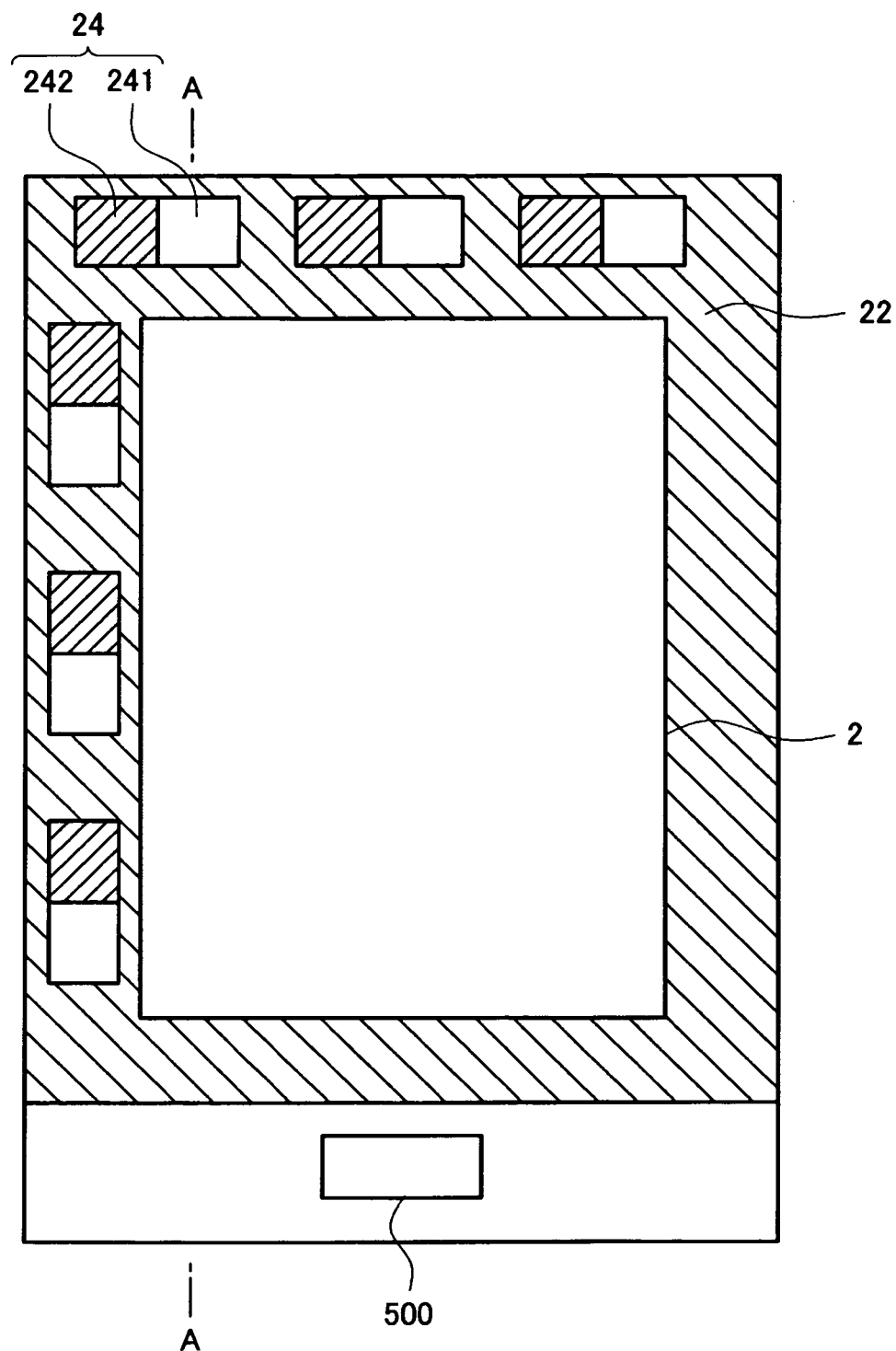
FIG. 4 is a plan view of the display device according to Example 1.

FIG. 4 is a schematic plan view of FIG. 1 as viewed from above. In FIG. 4, the outside of the effective screen part 2 is covered by the upper light-blocking layer 22, and windows 24 for the photosensor TFTs 130 are formed in portions corresponding to the photosensor parts 3. However, these windows 24 are formed from opening parts 241 on which light is actually incident, and light-blocking parts 242 by which light is blocked. Photosensor TFTs 130 are disposed correspondingly with respect to the opening parts 241, and correction sensor TFTs 133 are disposed correspondingly with respect to the light-blocking parts 242. Each of the windows shown in FIG. 4 corresponds to a single function; however, ordinarily, a plurality of photosensor TFTs 130 and correction sensor TFTs 133 are formed for each of the windows 24, and the total current of such a plurality of sensor TFTs is utilized as a detection signal.

Figure 5:
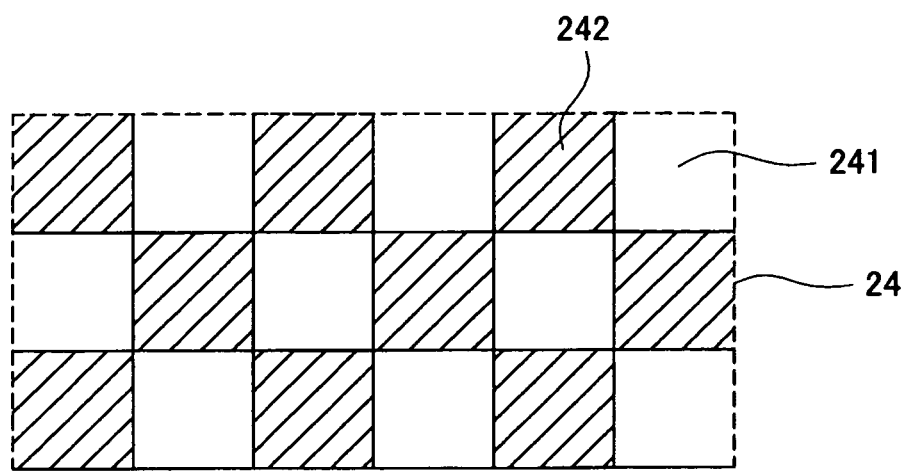
FIG. 5 shows an example of the sensor window part.

In FIG. 4, a sensor TFT group used to display a single function is formed for a single window 24. However, as is shown in FIG. 5, it would also be possible to form small opening parts 241 for respective photosensor TFTs 130 within a single window 24, and to cover the portions where no window sensor TFT 130 is present with light-blocking parts 242.

Photosensor TFTs 130 are associated with the small opening parts 241, and correction sensor TFTs 133 are associated with the light-blocking parts 242, in the same manner as in FIG. 4 and the like. This fine pattern can be readily formed provided that it is created at the same time as the BM 23. Providing the small opening parts 241 correspondingly with respect to the photosensor TFTs 130 thus results in the merits of enabling unnecessary noise to be avoided, and reducing the effect of outside light on peripheral circuit devices.

The liquid crystal panel is illuminated with light from the back lighting 50. If intense light from the back lighting constantly illuminates the liquid crystal display panel, the variation in the amount of light from outside light is difficult to detect. In the present example, therefore, as is shown in FIG. 3, a lower light-blocking layer 300 is disposed beneath the lower polarizing plate 16 on the periphery of the effective screen.

Figure 6:
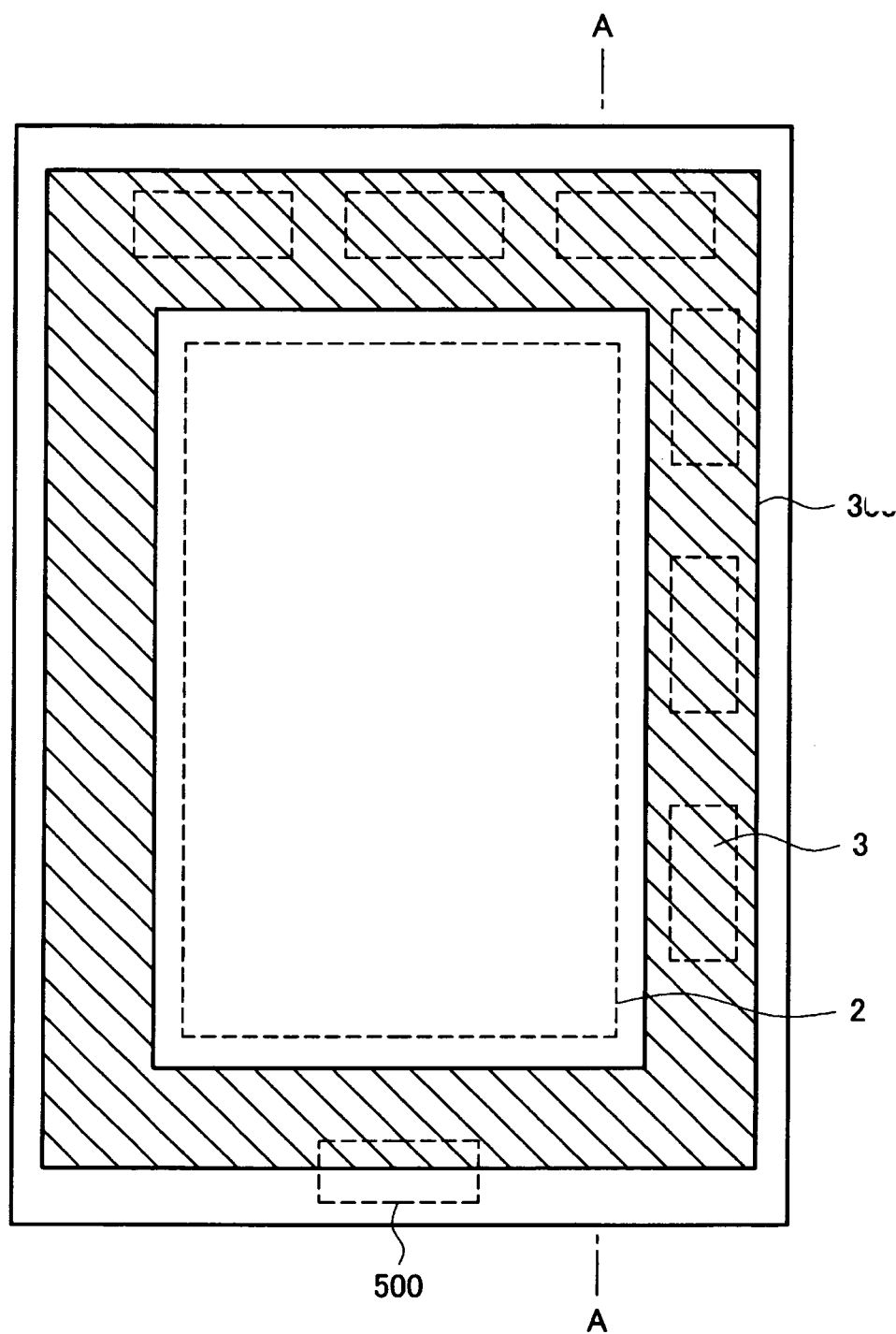
FIG. 6 is a back view of the display device according to Example 1.

FIG. 6 is a diagram of the liquid crystal display panel as viewed from the back side of the TFT substrate. The lower side of the TFT substrate 10 is covered by the lower light-blocking layer 300. Since the lower side of the TFT substrate 10 may be blocked from the light so that the light of the back lighting 50 does not reach the sensor TFTs 130 or correction sensor TFTs 133, it will suffice if a light-blocking layer is formed in the form of a band on the periphery of the effective screen. This light-blocking layer also doubles as a black sealing tape used to prevent the leakage of light from the back lighting in the vertical and horizontal directions, resulting in improved ease of operation and performance.

Figure 7:
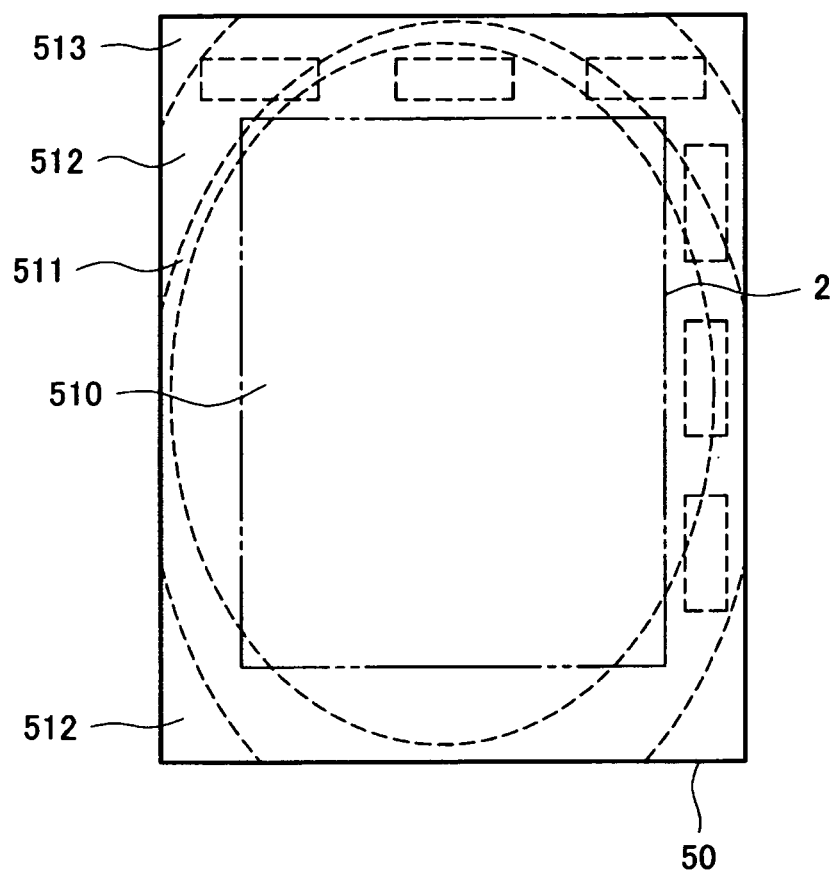
FIG. 7 shows an example of the illumination intensity distribution for the back lighting.

It is difficult to completely eliminate the effects of stray light from the back lighting even if the lower portions of the photosensor TFTs 130 and correction sensor TFTs 133 are covered by the lower light-blocking layer 300 as shown in FIG. 6. Specifically, the TFTs are formed on the TFT substrate which is made of glass; however, since the TFT substrate has a fixed thickness, light from the back lighting reaches the sensor TFTs 130 as stray light while being repeatedly reflected and the like. Light from the back lighting is not constant on the TFT substrates; for example, this light has a distribution such as that shown in FIG. 7. In FIG. 7, the numbers 510, 511, 512 and 513 indicate regions demarcated by contour lines of the light from the back lighting. It is indicated that the intensity of the light from the back lighting 50 gradually becomes smaller.

As is shown in FIG. 7, the intensity of the light from the back lighting is substantially constant within the effective screen part 2; however, in the peripheral parts where photosensor TFTs 130 and the like are disposed, the brightness distribution varies abruptly. Consequently, the amount of stray light directed toward the photosensor TFTs 130 also varies from place to place, and this fluctuating component gives rise to erroneous operation of the photosensors. In the present example, the correction sensor TFTs 133 are disposed in the vicinity of the photosensor TFTs 130, and prevent erroneous operation by correcting the fluctuating components of stray light.

In the photosensors, the current also fluctuates greatly with respect to temperature variations. In the present example, fluctuations with respect to temperature variations can also be minimized by disposing pairs of correction sensor TFTs 133 and photosensor TFTs 130 of the same size.

Figure 8:
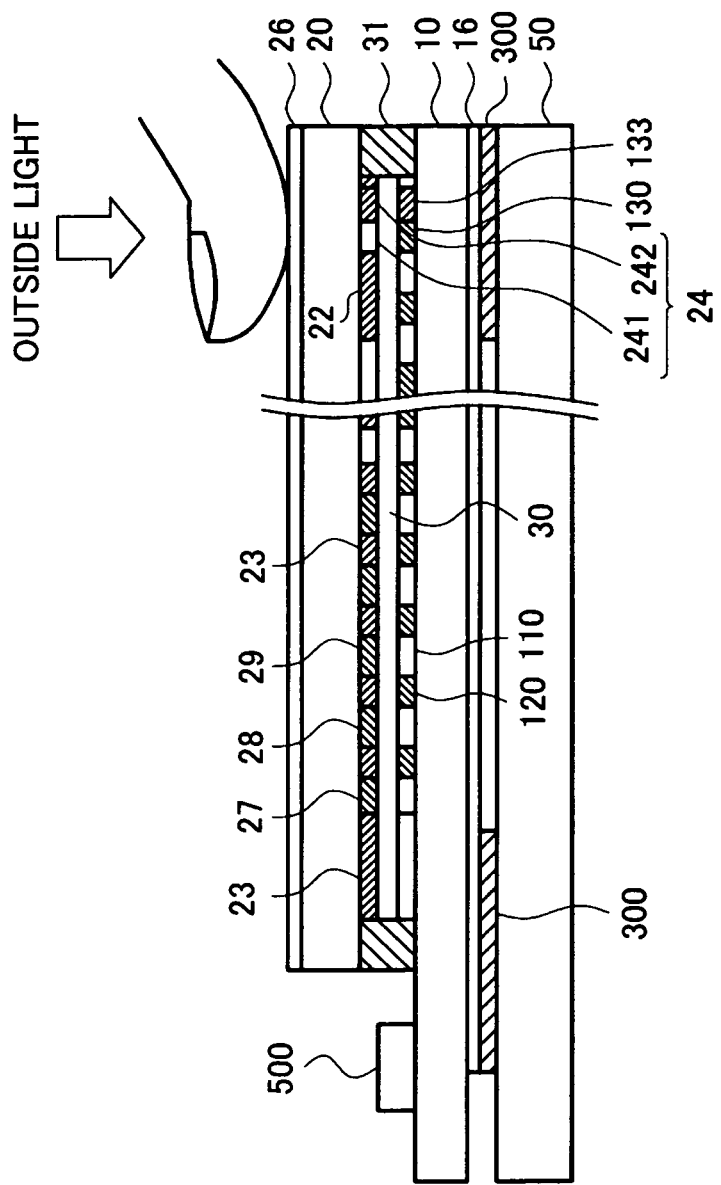
FIG. 8 is a sectional view showing the operation of the display device according to Example 1.

FIG. 8 shows a state in which a window 24 corresponding to a sensor TFT part formed on the periphery of the effective screen is touched by the finger of a user, and light from the outside part is prevented from reaching the photosensor TFT 130. Since light from the back lighting 50 is blocked by the lower light-blocking layer 300, the photo-electric current generated in the photosensor TFT 130 is blocked, and the photo-electric current is converted into a voltage, and sent to the signal processing part 5 via a P/S converter circuit 4. In FIG. 8, each window 24 is constructed from an opening part 241 and a light-blocking part 242. Photosensor TFTs 130 are formed on the TFT substrate 10 corresponding to the opening parts 241, and correction sensor TFTs 133 are formed on the TFT substrate corresponding to the light-blocking parts 242.

Figure 9:
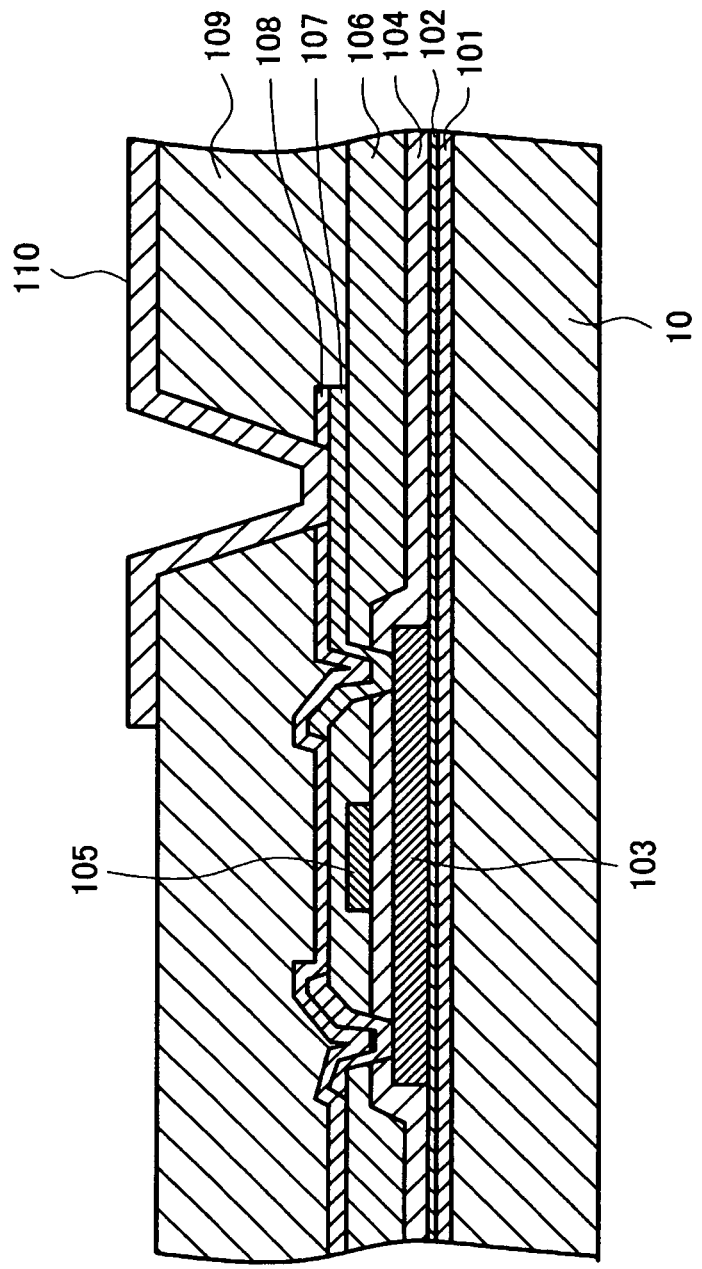
FIG. 9 is a sectional view of the pixel part TFT.

The photosensor TFTs 130 have the same construction as the pixel part TFTs 120 and driving circuit TFTs, and are manufactured at the same time, which is advantageous in terms of yield, cost, and the like. FIG. 9 is a sectional view of a pixel part TFT 120. In the case of polysilicon TFTs, so-called top gate TFTs are used.

In FIG. 9, a two-layer film comprising an SiN film 101 and an $SiO_2$ film 102 is formed as an under-layer film on top of a glass substrate 10. This is done in order to prevent the contamination of the semiconductor layers with impurities from the glass substrate 10. A polysilicon semiconductor layer 103 is formed on top of the $SiO_2$ film. A gate insulating film 104 is formed by $SiO_2$ or SiN on top of the semiconductor layer 103. After the gate insulating film 104 is formed, for example, an MoW layer is formed as a gate electrode 105 by sputtering.

The gate electrode 105 is formed by etching utilizing a photo-resist. After the gate electrode has been etched, but before the photo-resist is removed, ion implantation is performed, and the semiconductor layer 103 is subjected to doping so that this layer becomes n+. According to this method, three regions are formed in the semiconductor layer 103 as shown in FIG. 10.

Figure 10:
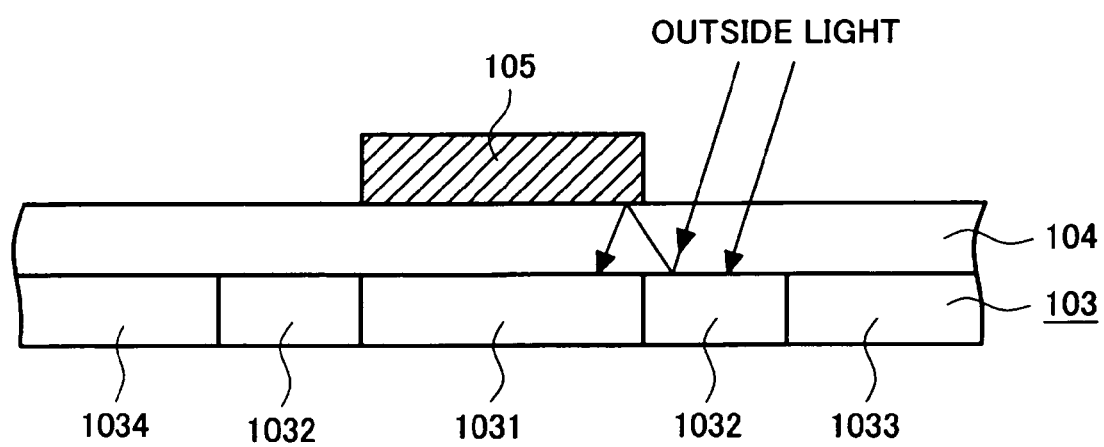
FIG. 10 is a detailed view of the TFT part.

In FIG. 10, a p type conductor layer 1031 constituting a channel part located directly beneath the gate electrode is a p type semiconductor. Lightly doped drain (LDD) parts 1032 which are lightly doped with ions that form an N type are formed on both sides of the p type semiconductor layer 1031. This is because the ion doping amount is small since ions are driven in via the photo-resist. The ions used to form an n+ region are sufficiently driven into the other regions, so that these are portions with a high conductivity. These portions form drain parts 1033 or source parts 1034 of the TFTs.

Inter-layer insulating films 106 are formed from $SiO_2$ or SiN on top of the gate wiring including the gate electrodes 105. Through-holes are formed in order to form electrical contacts in the inter-layer insulating films, whereupon laminated films of Al—Si, MoW, and the like are deposited by sputtering, and source/drain wiring layers 107 and the like are formed by photolithography. Subsequently, an inorganic passivation film 108 is formed by SiN in order to protect the TFTs.

An organic passivation film 109 used to cover and flatten the inorganic passivation film 108 is formed. After through-holes used to ensure electrical continuity of the source/drain wiring layer 107 and pixel electrodes 110 are formed in the inorganic passivation film 108 and organic passivation film 109, transparent electrodes ITO constituting pixel electrodes 110 are deposited by sputtering. Pixel electrodes 110 are formed by patterning these transparent electrodes.

The photosensor TFTs 130 also have basically the same structure. However, in the sensor TFT parts, there is no need for pixel electrodes 110 of the type shown in FIG. 8. The TFT parts formed on the pixel electrode part shown in FIG. 8 were described as an example; however, it shall be apparent that photosensor TFTs can be also formed by a process similar to driving circuits based on TFTs formed on the periphery of the effective screen.

In the photosensor TFTs 130, there is a need to generate a carrier via the outside light; however, the gate electrodes 105 are formed using a metal film, and are opaque, so that outside light does not directly reach the p type semiconductor layer 1031 beneath the gate electrodes 105. Meanwhile, as is shown in FIG. 9, outside light directly reaches the LDD parts 1032. Since a photo-carrier is also generated in the LDD parts 1032, the photosensor TFTs 130 function as photosensor parts 3.

Furthermore, because of reflection and diffraction, a portion of the outside light also reaches the p type semiconductor layer 1031 which is a channel part beneath the gate electrodes 105; accordingly, a photo-carrier is also generated in this part, and the photosensor TFTs 130 can operate as photosensor parts 3.

Figure 11:
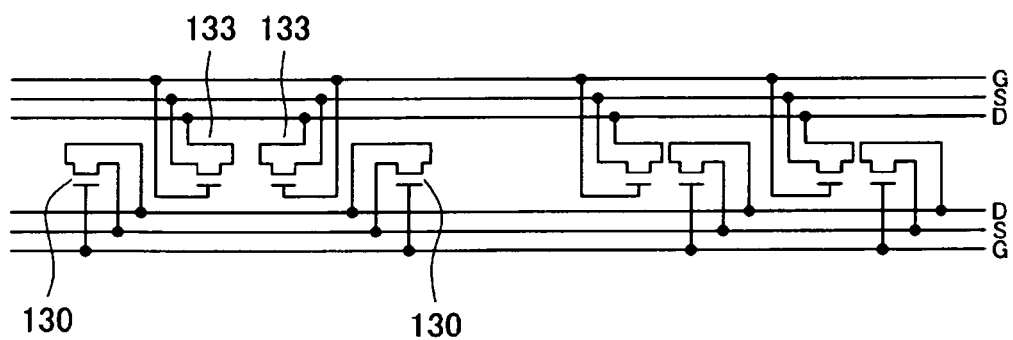
FIG. 11 shows an example of the layout of the photosensor transistors and correction sensor transistors.

FIG. 11 is a circuit diagram showing a state in which numerous photosensor TFTs 130 and correction sensor TFTs 133 are disposed on the photosensor parts 3. In FIG. 11, G, S and D respectively indicate gate lines, source lines, and drain lines of the photosensor TFTs 130 and correction sensor TFTs 133. FIG. 11 indicates that the photosensor TFTs 130 and correction sensor TFTs 133 are disposed in close proximity. This is done in order to ensure that the effects of stray light and heat are the same in the photosensor TFTs 130 and correction sensor-TFTs 133.

Figure 12:
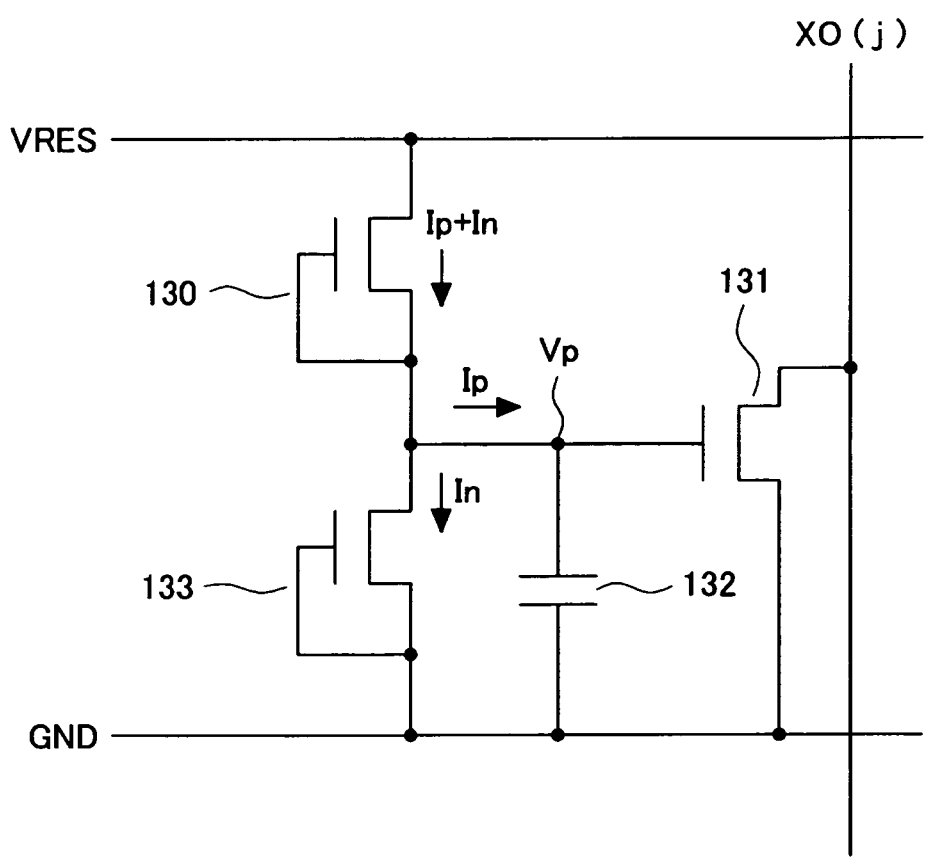
FIG. 12 is a circuit diagram of the equivalent circuit of the photosensor part.

FIGS. 12 through 15 are circuit diagrams showing the operation of the photosensor TFTs 130 as photosensor parts 3 in the present example. FIG. 12 is an equivalent circuit diagram of the photosensor parts 3. Basically, the photosensor parts 3 are constructed from photosensor TFTs 130 that function as diode-connected photodiodes, source-grounded TFTs 131, and integrating capacitors 132. However, in the present example, correction sensor TFTs 133 are connected in series with the photosensor TFTs 130 in order to correct for the effects of stray light and temperature.

Correction sensor TFTs 133 are formed with the same size as the photosensor TFTs 130 in the vicinity of the photosensor TFTs 130. In addition to the photo-electric current Ip, a current In caused by heat or stray light from the back lighting flows through the photosensor TFTs 130. Accordingly, a current (Ip+In) flows through the photosensor TFTs 130. Meanwhile, since the correction sensor TFTs 133 are formed at the same size in the vicinity of the photosensor TFTs 130, the same current In as that of the photosensor TFTs 130 flows through these correction sensor TFTs 133.

Accordingly, as a result of the use of the construction shown in FIG. 12, Ip, which is the difference between the current (Ip+In) of the photosensor TFTs 130 and the current (In) of the correction sensor TFTs 133, is input into the integrating capacitors 132. The drains of the photosensor TFTs 130 are connected to the reset line VRES, and the sources of the photosensor TFTs 130 are connected to the correction sensor TFTs 133 and integrating capacitors 132. The drains of the source-grounded TFTs 131 are connected to the outputs XO(j) of the photosensor parts 3, and the gates are connected to the integrating capacitors 132.

Figure 13:
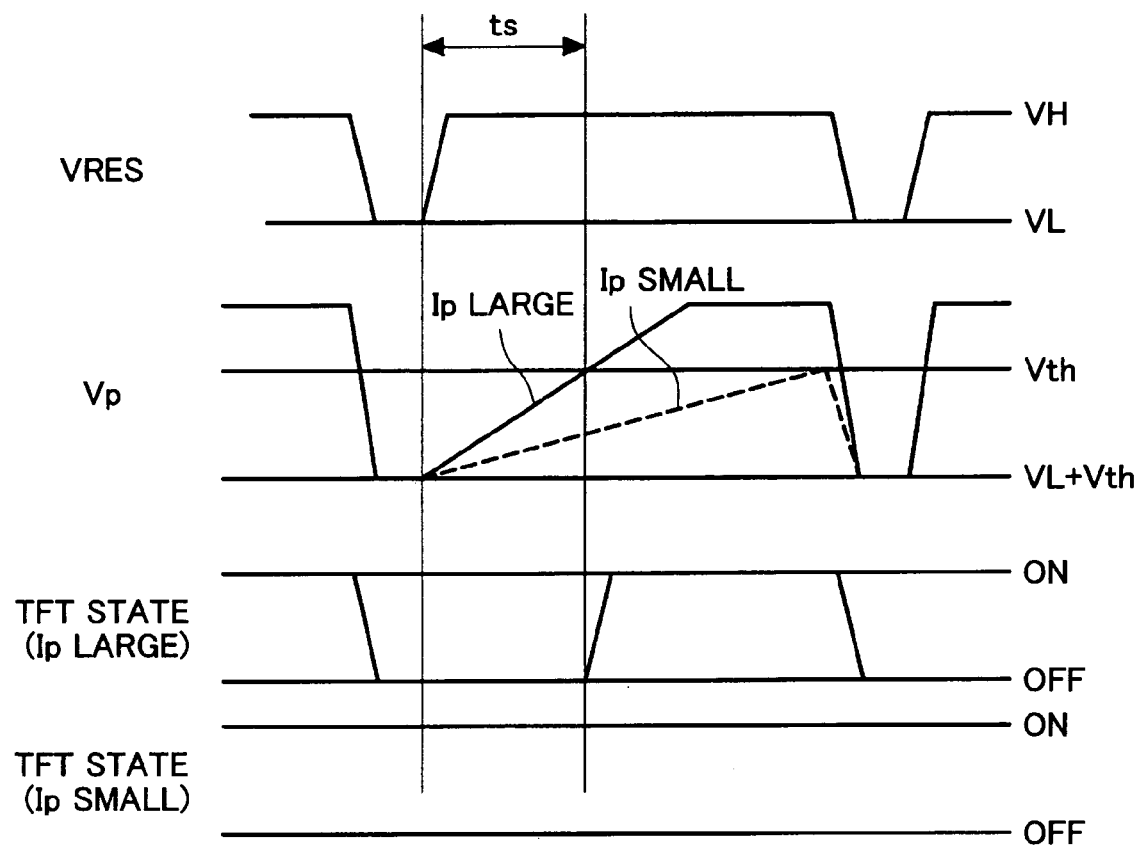
FIG. 13 is an operation timing chart of the photosensor part.

FIG. 13 is a timing chart used to illustrate the operation of the photosensor circuit shown in FIG. 12. As is shown in FIG. 13, the VRES voltage is a binary signal, with a high-level voltage of VH, and a low-level voltage of VL. When the voltage of the reset line VRES is VL, the photosensor TFTs 130 have a forward bias as photodiodes; accordingly, the voltage Vp of the integrating capacitors 132 is VL+Vth1 (threshold voltage of the photodiode).

Furthermore, when the voltage of the reset line VRES is VH, the photosensor TFTs 130 have a reverse bias as photodiodes; accordingly, a photo-electric current Ip flows in accordance with the intensity of the light illuminating the photodiodes.

Since the photo-electric current Ip is integrated by the integrating capacitor 132, the voltage Vp rises with time as shown in FIG. 13. This slope is proportional to the photo-electric current Ip. In FIG. 13, "Ip large" indicates cases in which the photo-electric current Ip is large (cases in which the intensity of the light is strong), and "Ip small" indicates cases in which the photo-electric current is small (cases in which the intensity of the light is weak).

The TFTs 131 whose gates are connected to the integrating capacitors 132 are in an "off" state when Vp can be expressed by the relation Vp≤Vth2, and are in an "on" state when Vp can be expressed by the relation Vp>Vth2. Accordingly, as is indicated by "Ip large" in FIG. 13, in cases where the photo-electric current Ip is large, the TFTs 131 are switched from an "off" state to an "on" state at the point in time at which the voltage Vp exceeds the threshold voltage Vth2, and in the case of "Ip small" in FIG. 13, the TFTs 13 remain in an "off" state.

The photosensor TFTs 130 and TFTs 131 are formed by the same TFT manufacturing process; accordingly, the threshold voltage Vth1 of the photosensor TFTs 130 and the threshold voltage Vth2 of the TFTs 131 are substantially equal, and it may be assumed that the relationship Vth=Vth1=Vth2 holds true. In this case, the time difference ts from the point in time at which the photo-electric current Ip and the voltage of the reset line VRES start to rise up to the point in time at which the voltage Vp exceeds the threshold voltage Vth2 can be expressed by the following equation, where Cp is the capacitance of the integrating capacitor 132.

$$ts = Cp \times VL/Ip$$

It is seen from this equation that the time difference ts is inversely proportional to the photo-electric current, that the coefficient is determined by the integrated capacitance Cp and low-level voltage VL of the reset line VRES, and that the threshold voltage Vth2 of the TFTs is not included. It is seen from this that the photosensor circuit shown in FIG. 12 does not depend on the threshold voltage Vth2 of the TFTs; accordingly, the photo-electric current (Ip) can be stably detected.

Figure 14:
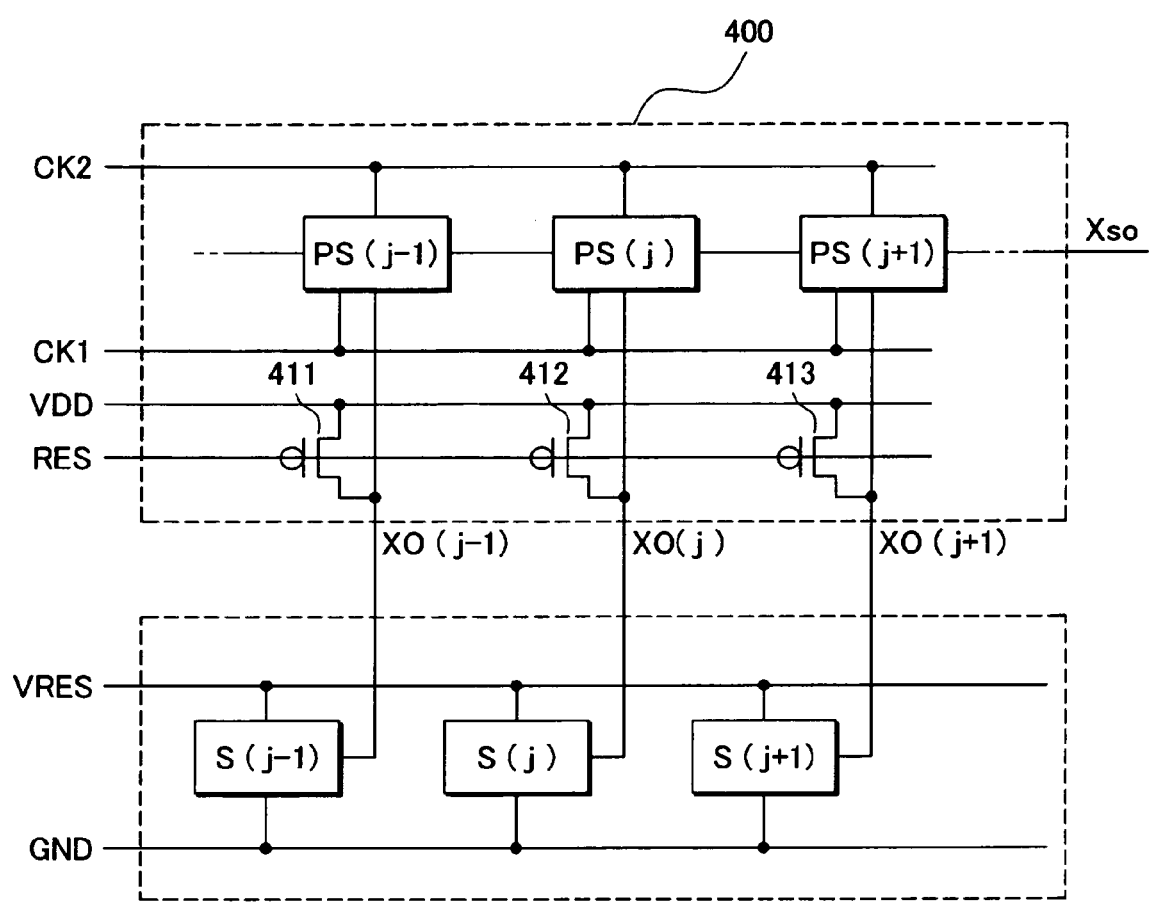
FIG. 14 is a circuit construction diagram including the peripheral circuits of the photosensor part.

FIG. 14 is a circuit diagram showing the circuit construction including the photosensor circuits and peripheral circuits in the present example. In FIG. 14, S(j) indicates the photosensor circuits shown in FIG. 12. A power supply line which supplies a ground voltage GND to the photosensor circuits S(j) and the reset line VRES are respectively connected in common on the outside of the effective screen 2.

The output circuit 400 is constructed from parallel input/series output circuits (hereafter referred to as PS circuits) PS(j) and initialization TFTs (411 through 413) used to initialize the output lines XO(j). The initialization TFTs (411 through 413) are p type thin-film transistors. The initialization TFTs (411 through 413) form an initialization circuit.

Clocks (CK1 and CK2) and the output lines XO(j) are input into the PS circuits PS(j). Furthermore, a signal from the preceding PS circuit PS(j-1) is input into the PS circuit PS(j), and the PS circuit PS(j) outputs a signal to the next PS circuit PS(j+1). A power supply voltage VDD is applied to the drain of each of the initialization TFTs (411 through 413), a reset signal RES is applied to the gate, and the sources are respectively connected to the output lines XO(j).

Figure 15:
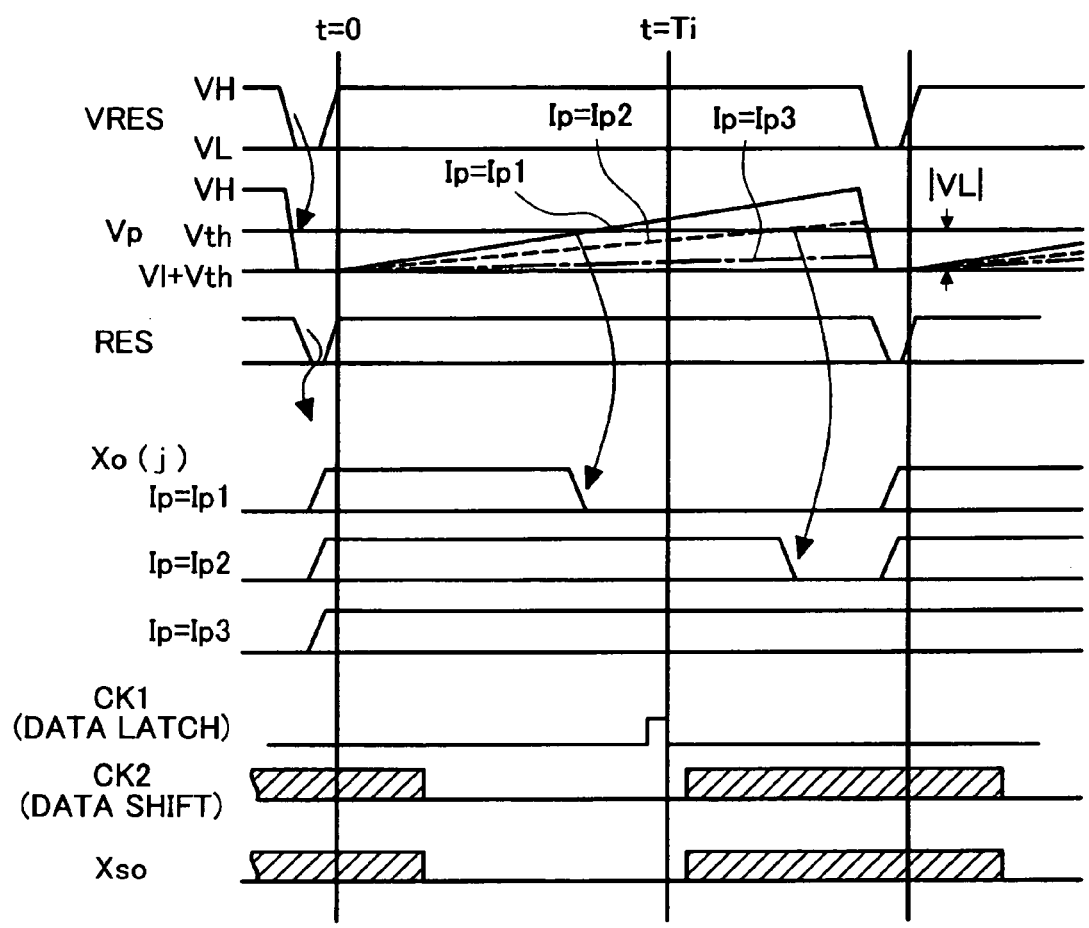
FIG. 15 is an operation timing chart of the circuit shown in FIG. 14.
Figure 16:
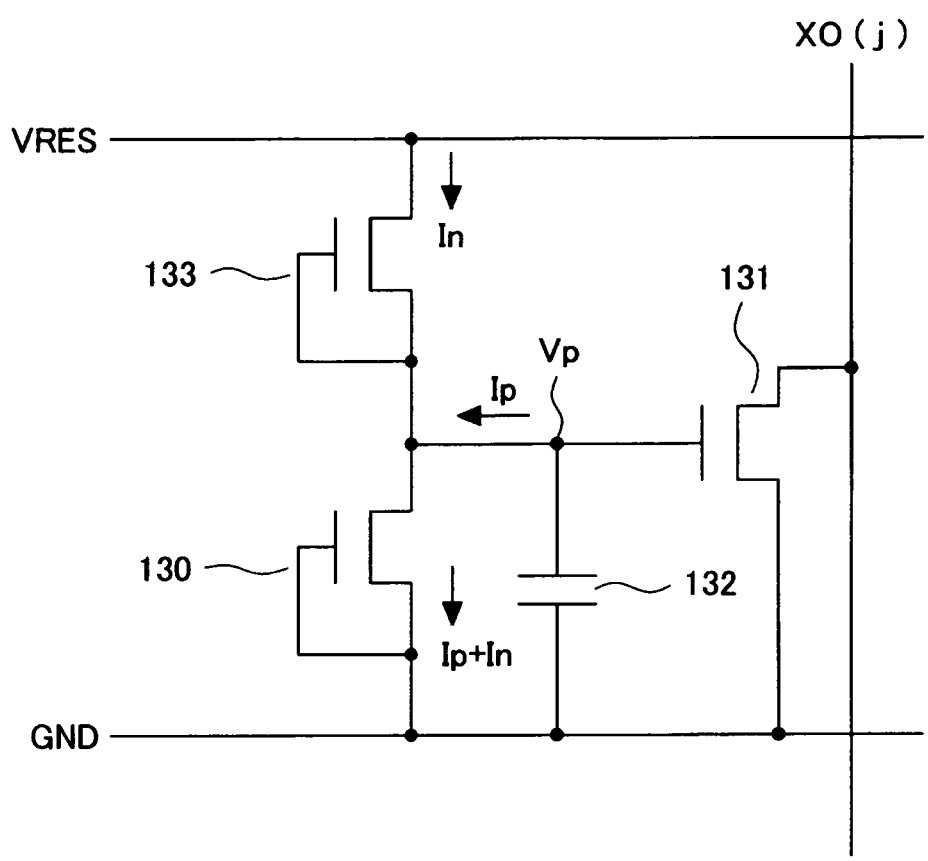
FIG. 16 is an equivalent circuit according to another example of the photosensor part.

FIG. 15 is a timing chart used to illustrate the operation of the photosensor circuits S(j) and peripheral circuits of the same shown in FIG. 14. The timing of the voltage of the reset line VRES and the voltage of Vp are the same as in the example shown in FIG. 13. FIG. 16 shows the cases of three sets of conditions in terms of the photo-electric current Ip, i.e., Ip1, Ip2, and Ip3. The reset signal RES is the signal used to initialize the output line XO(j), XO(j) is the voltage of the output line XO(j), (CK1 and CK2) are the control signals of the PS circuit, and Xso is the output of the output circuit 400. The voltage Vp is the same as the waveform shown in FIG. 13.

When the reset signal RES is at a low level (hereafter referred to as an L level), the TFTs (411 through 413) are in an "on" state, and the output line is initialized to the power supply voltage VDD. Thereafter, if the voltage Vp exceeds the TFT threshold voltage, the photosensor circuit TFTs will assume an "on" state, and the voltage XO(j) of the output line will be at an L level. The point in time t at which a switch is made from the H level to the L level varies according to the value of the photo-electric current Ip. When Ip is Ip3, there is no switching to the L level.

The clock CK1 is a clock for incorporating data of the output line into the PS circuit (data latch clock). In FIG. 15, an example is shown in which the clock CK1 is input at a timing of t=Ti. The clock CK2 is a data shift clock for the PS circuit. The data of the PS circuit incorporated at the timing of the clock CK1 is shifted according to the clock CK2, and the data is output to Xso.

The amount of light input into the photosensor part 3 can be judged by counting the output values for each fixed period of time as in the above description. In the example shown in FIG. 15, when the photo-electric current Ip=Ip1, the output is counted as zero, and in cases where Ip is Ip2, Ip3 or the like, which is smaller than this, the output is counted as 1.

In the example, outside light is ordinarily incident on the photosensor part 3, e.g., Ip=Ip1; ordinarily, therefore, the output is zero. However, when a person touches a substrate corresponding to the sensor part with the fingers, the outside light is blocked, and the output changes to 1. Consequently, the function that has been selected can be judged.

The degree of the change in the light is used to determine whether the finger of a user has touched the substrate corresponding to the sensor part. This can be determined by the timing Ti in FIG. 15. Specifically, if Ti in FIG. 15 is lengthened, a larger change in Ip; i.e., a larger change in the light quantity, is detected, and if Ti is shortened, a smaller change in Ip, i.e., a smaller change in the light quantity, is detected.

In the above description, a case was described in which the photosensor circuit had photosensor TFTs 130 connected to a reset line VRES, and correction sensor TFTs 133 were grounded, as shown in FIG. 12. However, it would also be possible to ground photosensor TFTs, and to connect correction sensor TFTs 133 to a reset line VRES. Such a circuit is shown in FIG. 16. In this case as well, noise current In, such as a photo-electric current caused by stray light, a current caused by heat, and the like flow to the photosensor TFTs 130 in a superimposed configuration in addition to the photo-electric current Ip. Among these, the noise current In flows to the correction sensor TFTs 133, and only the photo-electric current Ip flows to the accumulation capacitors 132, and varies the potential Vp.

EXAMPLE 2

In this example, the photosensor TFTs 130 used as photodiodes have a construction similar to that of the pixel part TFTs 120, and also offer the advantage of allowing manufacture by the same process. However, compared to cases in which these are manufactured exclusively for use as photosensors, there may be instances in which the photo-sensitivity is insufficient. In Example 2, the amount of change in the photo-electric current can be detected more easily in such cases as a result of photosensor TFTs 130 being connected in parallel.

Figure 17:
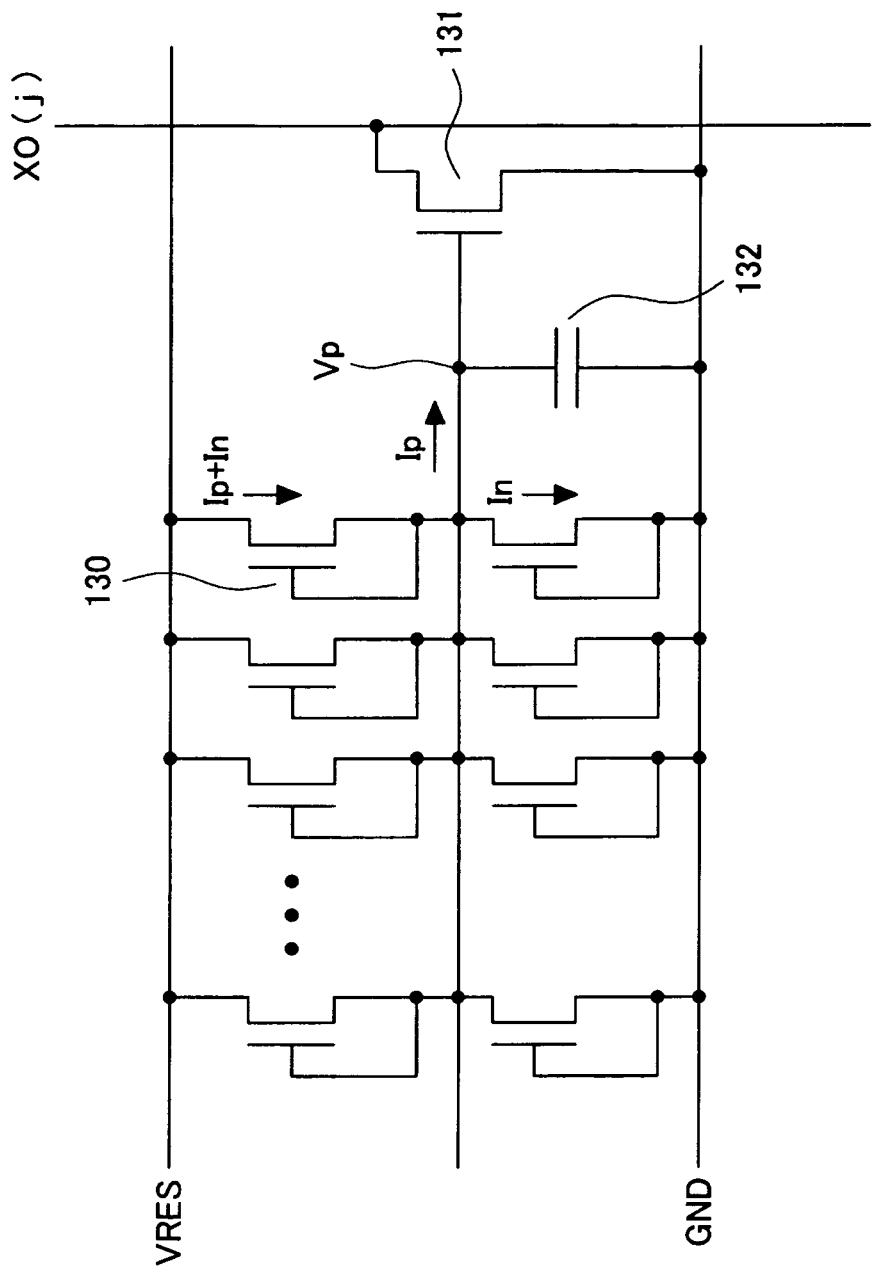
FIG. 17 is an equivalent circuit of the photosensor part of a display according to Example 2.

FIG. 17 shows an equivalent circuit of the photosensor part 3 in Example 2. In the equivalent circuit shown in FIG. 17, photosensor TFTs 130 used as photodiodes are connected in parallel, and correction sensor TFTs 133 are connected in series with the respective photosensor TFTs 130. The photosensor TFTs 130 and the correction sensor TFTs 133 connected in series with the photosensor TFTs 130 are disposed in close proximity to each other, and the effects of stray light, effects of temperature, and the like are corrected for by the correction sensor TFTs 133; only the photo-electric current Ip accumulates in the accumulation capacitors 132. The other operations are similar to those shown in FIG. 12 of Example 1.

In this construction, even if the photo-electric current of the respective photosensor TFTs 130 is small, or the change in the photo-electric current is small, the sensitivity can be improved since the photo-electric current from the parallel-connected TFTs is added. If the total photo-electric current is large, the margin in the degree of the change in the light quantity that makes it possible to determine whether the finger of the user has touched a substrate corresponding to the photosensor part 3 can also be increased.

In the present example, the photosensor TFTs 130 and correction sensor TFTs 133 have the same construction as the pixel part TFTs 120 or the driving circuit part TFTs formed on the periphery of the effective screen part 2, and can be formed by the same process. Accordingly, the manufacturing yield can be maintained even if the number of photosensors or the like is increased. The photo-electric current detection circuit in the present example is similar to the detection circuit shown in FIGS. 13 through 15.

EXAMPLE 3

As is shown in FIG. 8, the display device of the embodiment of the present invention is a display device in which photosensor TFTs 130 are disposed in correspondence with photosensor windows (windows 24) formed on the outside of the effective screen part 2, and the variation in the light by touching the windows 24 with a finger is detected. In this case, if the windows 24 are large, noise tends to be picked up. For example, even in cases where the sensor part 3 for selecting another function is touched with a finger, there may be instances in which the shadow of the fingers or the like is detected, and a signal is output. On the other hand, in cases where the windows 24 formed in the photosensor parts 3 are large, there may be a problem in terms of the deterioration of the external appearance of the display as a whole as a result of the generation of reflected light from the metal electrodes, e.g., gate electrodes, source electrodes, drain electrodes, and the like, formed in these parts.

In the present example, the size of the detection windows formed in the photosensor parts 3 is limited in order to counter these problems. In the present example, the photosensor TFTs 130 are used as photosensors; however, the parts that produce the photo-electric current Ip are the depletion layers formed in the drain parts of the TFTs. Accordingly, if light strikes the depletion layers, the sensitivity as photosensors can be maintained even if light does not strike the other portions of the photosensor TFTs 130.

Figure 18:
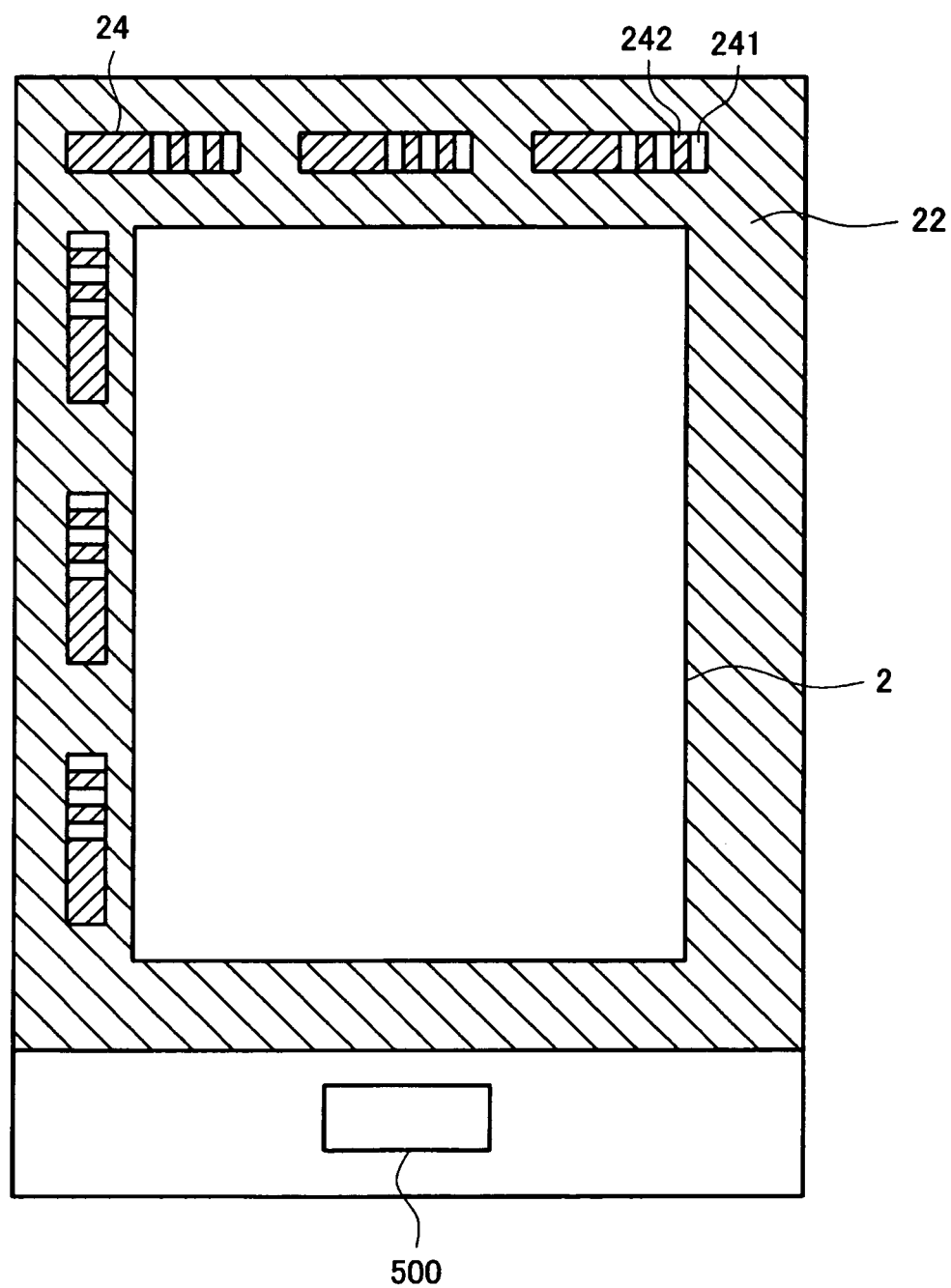
FIG. 18 is a plan view of a display device according to Example 3.

FIG. 18 is a schematic plan view of the present example. An upper light-blocking layer 22 is formed on the periphery of the effective screen part 2. Photosensors are disposed on the periphery of the effective screen part 2; however, windows 24 are formed in the light-blocking layer 22 in the parts corresponding to these photosensors. The windows 24 are further divided into opening parts 241 and light-blocking parts 242. Correction sensor TFTs 133 are formed in the vicinity of the photosensor TFTs 130, and portions of the correction sensor TFTs 133 are blocked from light by the light-blocking parts 242.

In the present example, not only are these light-blocking parts 242 formed on portions of the correction sensor TFTs 133; parts of the photosensor TFTs 130 other than the portions corresponding to the drains are also covered by light-blocking parts 242. Consequently, the area of the opening parts 241 can be reduced, and the noise light from the outside can be reduced. Furthermore, by covering portions other than the drains of the photosensor TFTs 130, it is possible to prevent reflections from other electrodes of the photosensor TFTs 130.

Figure 19:
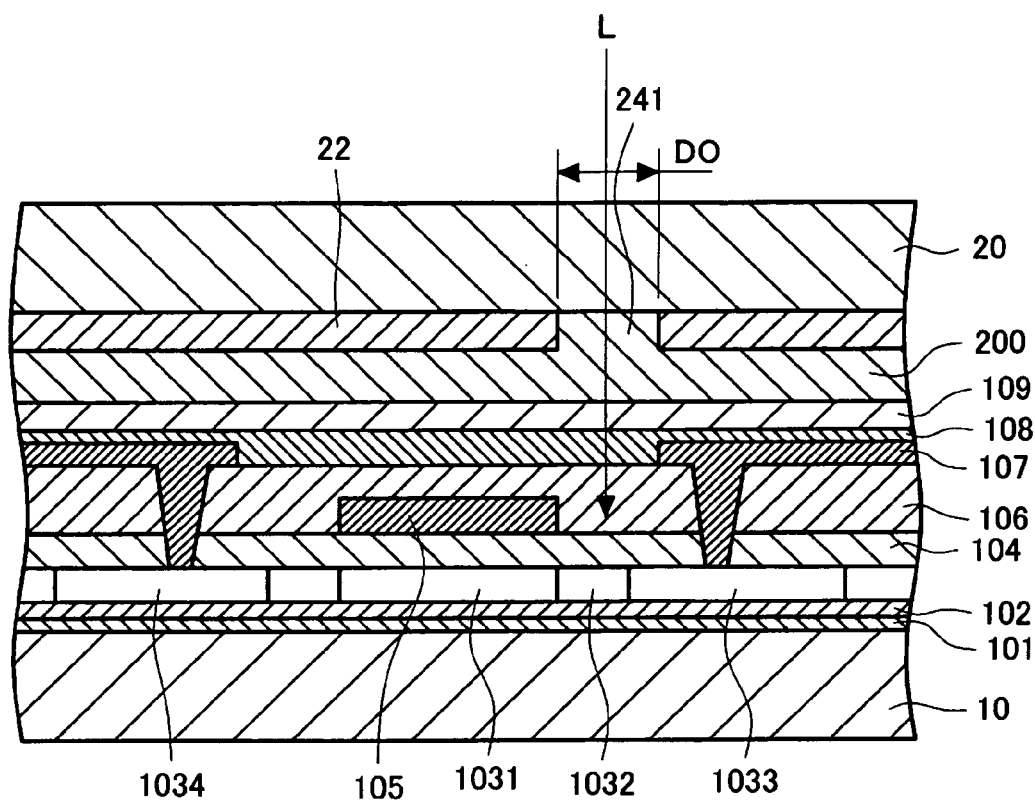
FIG. 19 is a sectional view of the photosensor part of Example 3.

FIG. 19 is a sectional view of the portions of the liquid crystal display panel on which photosensor TFTs 130 are formed in the present example. In FIG. 19, the construction of the TFT substrate 10 is the same as that described in FIGS. 9 and 10. Specifically, a semiconductor layer 103 is formed on top of the underlayer films 101 and 102. The semiconductor layer 103 is divided into a p type semiconductor layer 1031 constituting a channel part, an LDD part 1032 lightly doped with impurities, and a drain part 1033 and a source part 1034. A gate insulating film 104 is formed on top of the semiconductor layer 103, and a gate electrode 105 is formed on top of this.

An inter-layer insulating film 106 is formed on top of the gate electrode 105, and a passivation film 109 is layered on top of this. Through-holes are formed in the inter-layer insulating film 106 and gate insulating film 104, and the metal drain electrode and source electrode are connected to the drain part 1033 and source part 1034 of the semiconductor layer 103.

The color filter substrate 20 is disposed facing the TFT substrate with the liquid crystal layer 200 sandwiched in between. A light-blocking film 22 is formed from the same material as the black matrix 23 on the color filter substrate 20. Opening parts 241 are formed in the light-blocking film in portions corresponding to the drain parts 1032 and 1033 of the photosensor TFTs 130 formed on the TFT substrate. The other parts of the photosensor TFTs 130, e.g., the gate electrodes 105, source electrodes, and the like formed from metals, are blocked from light by the light-blocking film 22.

As is shown in FIG. 19, the opening parts 241 formed in the light-blocking film 22 are opened only in the portions corresponding to the semiconductor drain parts 1032 and 1033. Accordingly, reflection to the outside of the metal electrodes can be suppressed to a minimum. Furthermore, the generation of a photo-electric current occurs mainly in the drain parts 1032 and 1033; accordingly, the sensitivity as photosensors likewise shows substantially no deterioration. The width DO of the opening parts 241 shown in FIG. 19 is approximately 14 µm. On the other hand, in cases where opening parts are formed in correspondence with all parts of the photosensor TFTs 130, the width of the opening parts is approximately 40 µm.

Figure 20:
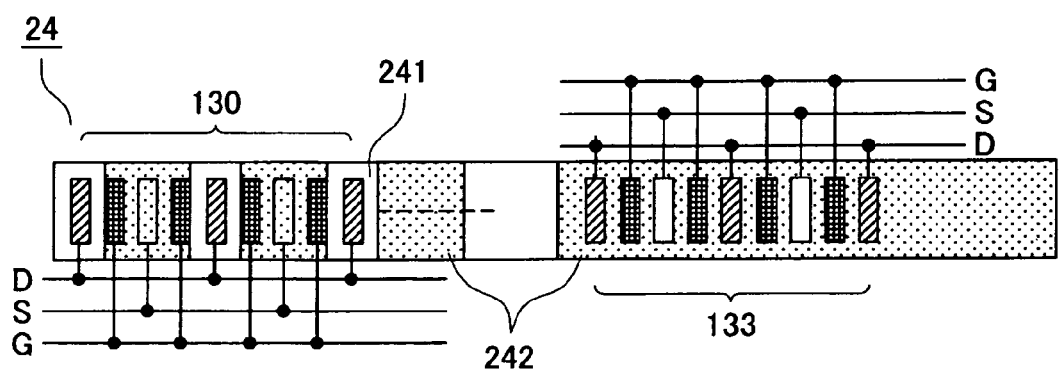
FIG. 20 is a diagram showing the relationship between the photosensor part and the light-blocking film in Example 3.

FIG. 20 is a schematic plan view of the windows 24 shown in FIG. 18. In FIG. 20, the windows 24 formed in the color filter substrate 20 are divided into opening parts 241 and light-blocking parts 242. The group of photosensor TFTs 130 and the group of correction sensor TFTs 133 formed on the TFT substrate 10 are disposed side by side. The correction sensor TFTs 133 are all covered by the light-blocking parts 242. The light-blocking parts 242 and opening parts 241 both correspond to the photosensor TFTs 130.

In FIG. 20, the opening parts 241 formed in the color filter substrate correspond to the portions of the drain electrodes connected to the drain lines D, and the light-blocking parts 242 of the color filter substrate correspond to the other electrodes, i.e., the gate electrodes, as well as drain electrodes and the like. In the present example, the area of the opening parts 241 formed in the color filter substrate 20 is thus extremely small, and a structure is obtained in which surrounding noise tends to be blocked. Furthermore, only the drain electrodes can be seen from the outside; accordingly, there is no deterioration of the external appearance of the display device.

In FIG. 20, the group of photosensor TFTs 130 and the group of correction sensor TFTs 133 are disposed as divided groups; however, it shall be apparent that it would also be possible to dispose single photosensor TFTs 130 and single correction sensor TFTs 133 adjacent to each other to form pairs, and to form a plurality of these pairs.

EXAMPLE 4

In the above examples, a case was described in which the display device 1 was a liquid crystal display device. The present invention can be applied not only to liquid crystal display devices, but also to organic EL display devices and the like. In the case of organic EL display devices as well, a schematic diagram of the display device is the same as FIG. 1. Specifically, photosensor parts 3 used to select functions are disposed on the periphery of the effective screen part 2.

Since organic EL display devices are self-luminous devices, these devices do not require backlighting, unlike liquid crystal display devices. Accordingly, in the case of organic EL display devices, it is necessary to consider only the prevention of stray light from the outside. Since TFTs are used to drive the respective pixels in the case of organic EL display devices as well, the manufacture of photosensor TFTs 130 similar to pixel part TFTs as photosensors on the periphery of the effective screen is the same as in a liquid crystal display device.

Figure 21:
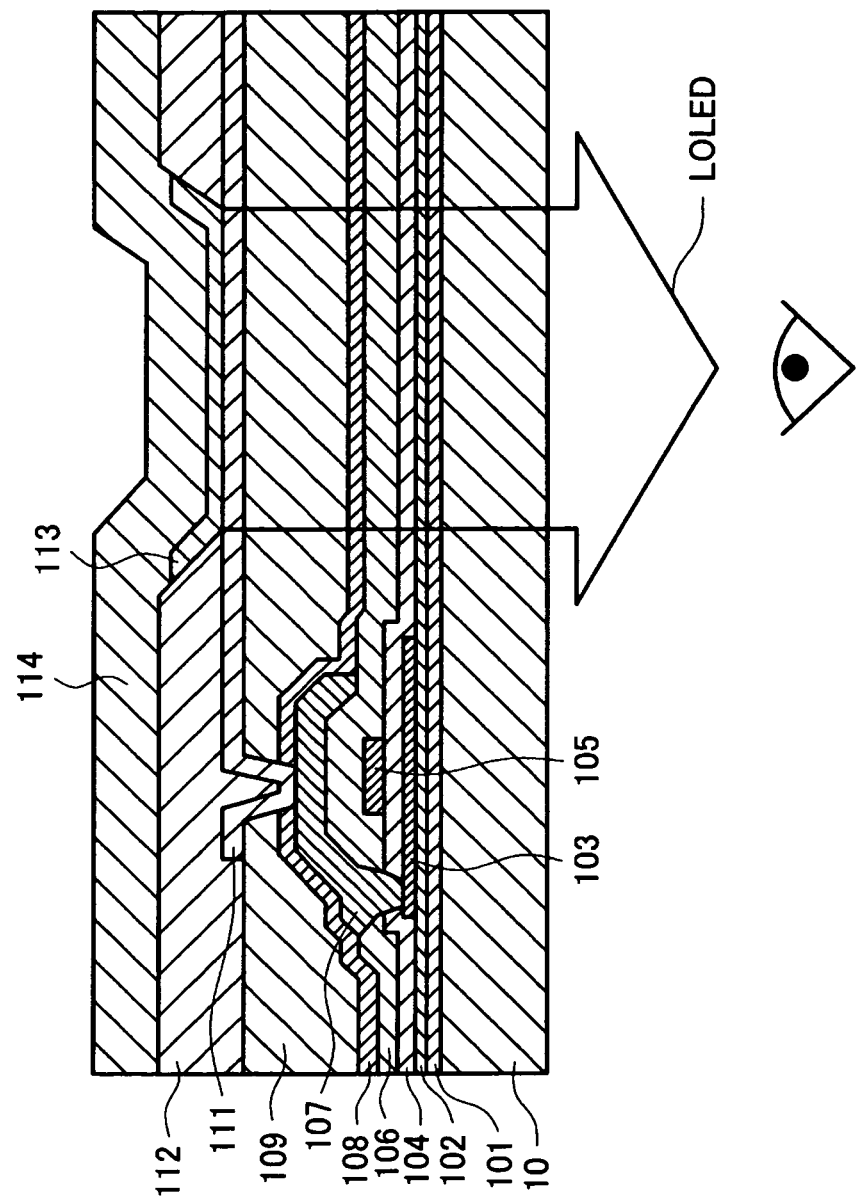
FIG. 21 is a sectional view of the pixel part of a bottom emission type organic EL display device.

Organic EL display devices include bottom emission type devices in which light from the pixels is emitted on the side of TFT substrate 10, and top emission type devices in which light from the pixels is emitted on the opposite side from the TFT substrate 10. FIG. 21 is a sectional view of a bottom emission type organic EL display device.

In FIG. 21, first, the formation of TFTs on the TFT substrate 10 is the same as in FIG. 9. Specifically, two underlayer films 101 and 102, a semiconductor layer 103, a gate insulating film 104, a gate electrode 105, an interlayer insulating film 106, a source/drain wiring layer (SD wiring) 107, an inorganic passivation film 108, and an organic passivation film 109 are formed on the TFT substrate 10 in the same manner as that described in FIG. 9.

In an organic EL display device, lower electrodes 111 are formed instead of the pixel electrodes shown in FIG. 9. However, these lower electrodes 111 are ITO, as with the pixel electrodes 110 shown in FIG. 9. In an organic EL display device, a bank 112 is formed in order to separate the pixels; an organic EL film 113 is then formed by vacuum evaporation. The organic EL film 113 ordinarily comprises five to six layers of an organic thin film. An upper electrode 114 made of Al or an Al alloy is formed on top of the organic EL film 113.

When a voltage is applied across the upper electrode 114 and lower electrode 111, the organic EL film 113 emits light; this light is directed toward the side of the TFT substrate 10. The light emitted on the opposite side from the TFT substrate 10 is reflected by the metal upper electrode 114, and is directed toward the side of the TFT substrate 10. The user recognizes the light emitted by the organic EL film 113 from the side of the TFT substrate 10, and recognizes an image.

Figure 22:
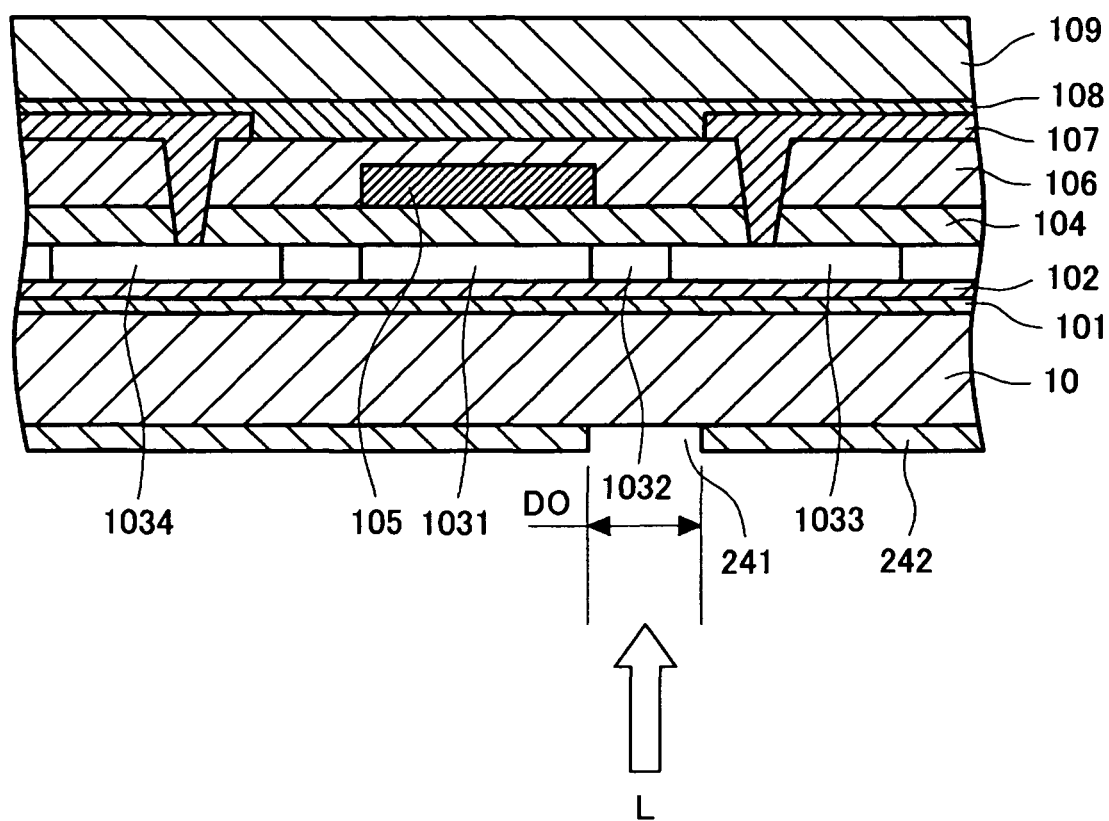
FIG. 22 is a sectional view of the photosensor part of the organic EL display device.

The photosensor TFTs 130 formed on the periphery of the effective screen have the same construction as the pixel part TFTs shown in FIG. 21, and are formed by the same process. FIG. 22 is a sectional view of the TFT parts used as photosensor TFTs 130. The construction of the TFTs is the same as that of the pixel part TFTs described in FIG. 21. In FIG. 22, the pixel electrodes, bank 112, and the like are omitted. However, the bank 112 may also be used as a protective layer.

In FIG. 22, the user touches their finger to the side of the TFT substrate 10 as a touch sensor. Light-blocking parts 242 are disposed on the outside of the TFT substrate, and the outside light is blocked. However, opening parts 241 are formed in portions corresponding to the drain parts 1032 and 1033 of the photosensor TFTs 130. Accordingly, outside light L strikes the drain parts 1032 and 1033 of the photosensor TFTs 130, and a photo-electric current ordinarily flows. When the user touches their finger to an opening part 241, the light is blocked, and the necessary signal is generated.

In the present example, the portions other than the drain parts 1032 and 1033 of the photosensor TFTs 130 are blocked from light by the light-blocking parts 242; accordingly, the following advantage is obtained: namely, stray light from the outside environment tends to be blocked. Furthermore, since openings are formed in the drain parts 1032 and 1033 where a photo-electric current is substantially generated, the sensitivity as photosensors is not greatly lowered.

In FIG. 22, only portions of the photosensor TFTs 130 were described; however, as in Example 1, the effects of heat, the effects of stray light from the outside environment, and the like can be corrected by disposing correction sensor TFTs 133 in the vicinity of the photosensor TFTs 130 in the same manner as in the case of a liquid crystal display device.

The circuit illustrated in FIGS. 12 through 15 can be used as a light signal detection circuit. The above has been a description of a bottom emission type organic EL display device; however, the present invention can also be similarly applied to top emission type organic EL display devices.

While there have been described what at present are considered to be certain embodiments of the invention, it will be understood that various modifications may be made hereto, and it is intended that the appended claims cover all such embodiments as fall within the true spirit and scope of the invention.

What is claimed is:

1. A display device having a substrate on which pixels are disposed in the form of a matrix on an effective screen, and an image signal applied to each of the pixels is controlled by a thin-film transistor corresponding to the respective pixels, wherein a photosensor formed using a thin-film transistor is disposed on the substrate on an outside of the effective screen, the photosensor generates a signal as a result of outside light being blocked, and the signal from the photosensor causes the display device to perform a specified function;

a correction sensor formed using a thin-film transistor is formed in the vicinity of the photosensor, and a light-blocking film is formed over the thin-film transistor of the photosensor for blocking the outside light, wherein an opening part in the light-blocking film is defined only over a drain region of the thin-film transistor of the photosensor such that a photo-electric current is generated in the drain region of the thin-film transistor of the photosensor, and a light-blocking layer is formed over the thin-film transistor of the correction sensor for blocking the outside light.

2. The display device of claim 1, wherein the photosensor and the correction sensor operate as a pair.

3. The display device of claim 1, further comprising:
   a plurality of photosensors formed using thin-film transistors being disposed on the substrate on an outside of the effective screen, each generating a signal as a result of outside light being blocked, the signals from the plurality of photosensors causing the display device to perform respective specified functions; and a plurality of correction sensors formed using thin-film transistors being formed in the vicinity of the plurality of photosensors respectively, wherein a light-blocking film is formed over the thin-film transistor of each of the plurality of photosensors for blocking the outside light, wherein an opening part in the light-blocking film is defined only over a respective drain region of each of the thin-film transistors of the plurality of photosensors such that a photo-electric current is generated in the respective drain region of each of the thin-film transistors of the plurality of photosensors, and a light-blocking layer is formed over the thin-film transistor of each of the plurality of correction sensors for blocking the outside light.

4. The display device of claim 1, wherein the photosensor and the correction sensor are formed adjacent to each other.

5. The display device of claim 1, wherein the photosensor and the correction sensor are formed by the same process as for the thin-film transistor corresponding to the pixels.

6. The display device of claim 1, wherein the thin-film transistor of the photosensor and the thin-film transistor of the correction sensor are the same size.

7. A liquid crystal display device having a TFT substrate on which a pixel electrode and a thin-film transistor that controls a signal voltage applied to the pixel electrode are formed in an effective screen, a color filter substrate on which a color filter and a black matrix are formed in an effective screen, a liquid crystal display panel in which an image is formed using a liquid crystal sandwiched between the TFT substrate and the color filter substrate, and a backlight, wherein a photosensor formed using a thin-film transistor is formed on the TFT substrate on an outside of the effective screen, the photosensor generates a signal as a result of outside light being blocked, and the signal from the photosensor causes the display device to perform a specified function;

a correction sensor formed using a thin-film transistor is formed in the vicinity of the photosensor; and a light-blocking film for blocking outside light is formed on the color filter substrate in a part corresponding to the photosensor and the correction sensor formed on the TFT substrate, wherein an opening part in the light-blocking film is formed only in a drain region of the thin-film transistor constituting the photosensor such that a photo-electric current is generated in the drain region of the thin-film transistors constituting the photosensor.

8. The liquid crystal display device of claim 7, wherein the photosensor and the correction sensor are formed by the same process as for the thin-film transistor used for the pixel electrode.

9. The liquid crystal display device of claim 7, wherein the photosensor and the correction sensor operate as a pair.

10. The display device of claim 1, wherein an organic EL layer is formed on the pixels.

11. The display device of claim 1, wherein
the thin-film transistor of the photosensor has a diode structure in which a gate of the thin-film transistor of the photosensor is connected to a drain or source of the thin-film transistor of the photosensor, and
the thin-film transistor of the correction sensor has a diode structure in which a gate of the thin-film transistor of the correction sensor is connected to a drain or source of the thin-film transistor of the correction sensor.

12. The display device of claim 11, wherein the thin-film transistor of the photosensor is connected in series with the thin-film transistor of the correction sensor.

13. The display device of claim 12, further comprising an output line which outputs the signal, and a second thin-film transistor a drain or source of which is connected to the output line, wherein
the drain or source of the thin-film transistor of the photosensor is connected to the drain or source of the thin-film transistor of the correction sensor via a connecting line; and
a gate of the second thin-film transistor is connected to the connecting line.

\* \* \* \* \*